US012713985B2

(12) United States Patent
Lee et al.

(10) Patent No.: US 12,713,985 B2
(45) Date of Patent: Aug. 18, 2026

(54) SEMICONDUCTOR PACKAGE INCLUDING STACKED CHIPS AND METHOD OF MANUFACTURING THE SEMICONDUCTOR PACKAGE

(71) Applicant: SAMSUNG ELECTRONICS CO., LTD., Suwon-si (KR)

(72) Inventors: Seyong Lee, Suwon-si (KR); Jungseok Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 544 days.

(21) Appl. No.: 18/301,541

(22) Filed: Apr. 17, 2023

(65) Prior Publication Data

US 2024/0063186 A1 Feb. 22, 2024

(30) Foreign Application Priority Data

Aug. 17, 2022 (KR) ........................ 10-2022-0102512

(51) Int. Cl.
*H01L 25/065* (2023.01)
*H10W 20/20* (2026.01)
(Continued)

(52) U.S. Cl.
CPC ........... *H10W 90/00* (2026.01); *H10W 20/20* (2026.01); *H10W 72/29* (2026.01); (Continued)

(58) Field of Classification Search
None
See application file for complete search history.

(56) References Cited

U.S. PATENT DOCUMENTS 8,313,984 B2 * 11/2012 Topacio ................ H01L 23/562 438/126
8,927,344 B2 * 1/2015 Topacio ............... H05K 1/0271 438/126
(Continued)

FOREIGN PATENT DOCUMENTS

KR 1562009 10/2015
KR 1020160025280 A 3/2016

OTHER PUBLICATIONS

Office Action dated Dec. 18, 2025 issued in corresponding to Korean Patent Application No. 10-2022-0102512.

*Primary Examiner* — Long Pham
(74) *Attorney, Agent, or Firm* — Morgan, Lewis & Bockius LLP

(57) ABSTRACT

A semiconductor package includes a first semiconductor chip including a substrate having a first upper surface and a first lower surface opposite thereto. The substrate has a central region and corner regions surrounding the central region. A plurality of through electrodes passes through the central region. A bonding pad is electrically connected to the through electrode and has a first height. A plurality of dummy pads respectively extend from the first upper surface on the corner regions of the substrate and have a second height that is higher than the first height. A second semiconductor chip has a second upper surface and a second lower surface opposite thereto. The second semiconductor chip is disposed on the first semiconductor chip through conductive bumps disposed on the second lower surface and electrically connected to the bonding pads.

9 Claims, 27 Drawing Sheets

(51) Int. Cl.

| | |
|---|---|
| ***H10W 90/00*** | (2026.01) |
| *H10W 72/29* | (2026.01) |
| *H10W 72/90* | (2026.01) |
| *H10W 74/15* | (2026.01) |

(52) U.S. Cl.

CPC ........ *H10W 72/952* (2026.01); *H10W 72/967* (2026.01); *H10W 74/15* (2026.01); *H10W 90/722* (2026.01); *H10W 90/732* (2026.01)

(56) References Cited

U.S. PATENT DOCUMENTS

| | | | | |
|---|---|---|---|---|
| 9,437,561 | B2 | 9/2016 | Cheng et al. | |
| 9,721,926 | B2 | 8/2017 | Choe et al. | |
| 9,875,992 | B2 | 1/2018 | Heo et al. | |
| 10,546,845 | B2 * | 1/2020 | Shen | H01L 24/24 |
| 11,222,873 | B2 | 1/2022 | Jun et al. | |
| 2016/0358892 | A1 | 12/2016 | Lee et al. | |
| 2021/0384162 | A1 * | 12/2021 | Choi | H01L 24/83 |

* cited by examiner

10
B'
A'
C2
C4
EA
CA
C1
C3
B
A 400
300
200
100
412
414
312
314
212
214
112
114
420
440
330
350
320
230
250
220
130
150
120
140
240
340
600
410
418
316
310
318
216
210
218
500
116
110
118

400
360
300
260
200
100
412
414
312
314
212
214
112
114
160
420
440
330
350
320
230
250
220
130
150
120
140
240
340
500
C
600
410
418
316
310
318
216
210
218
116
110
118

X AXIS
Y AXIS
C2
160b
C4
160d
130
CA
EA
C1
160a
C3
160c

Figure 19:
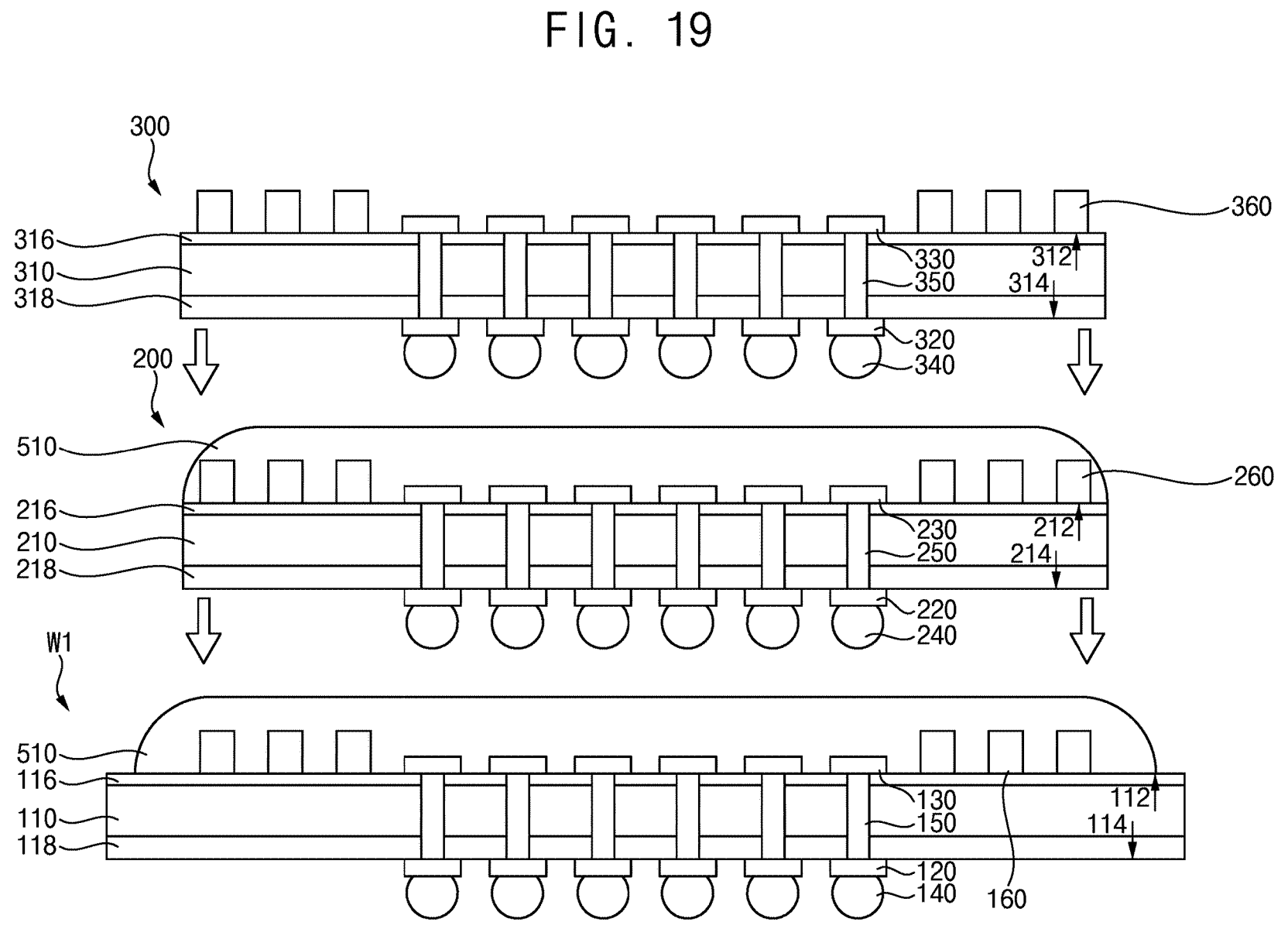

Figure 26:
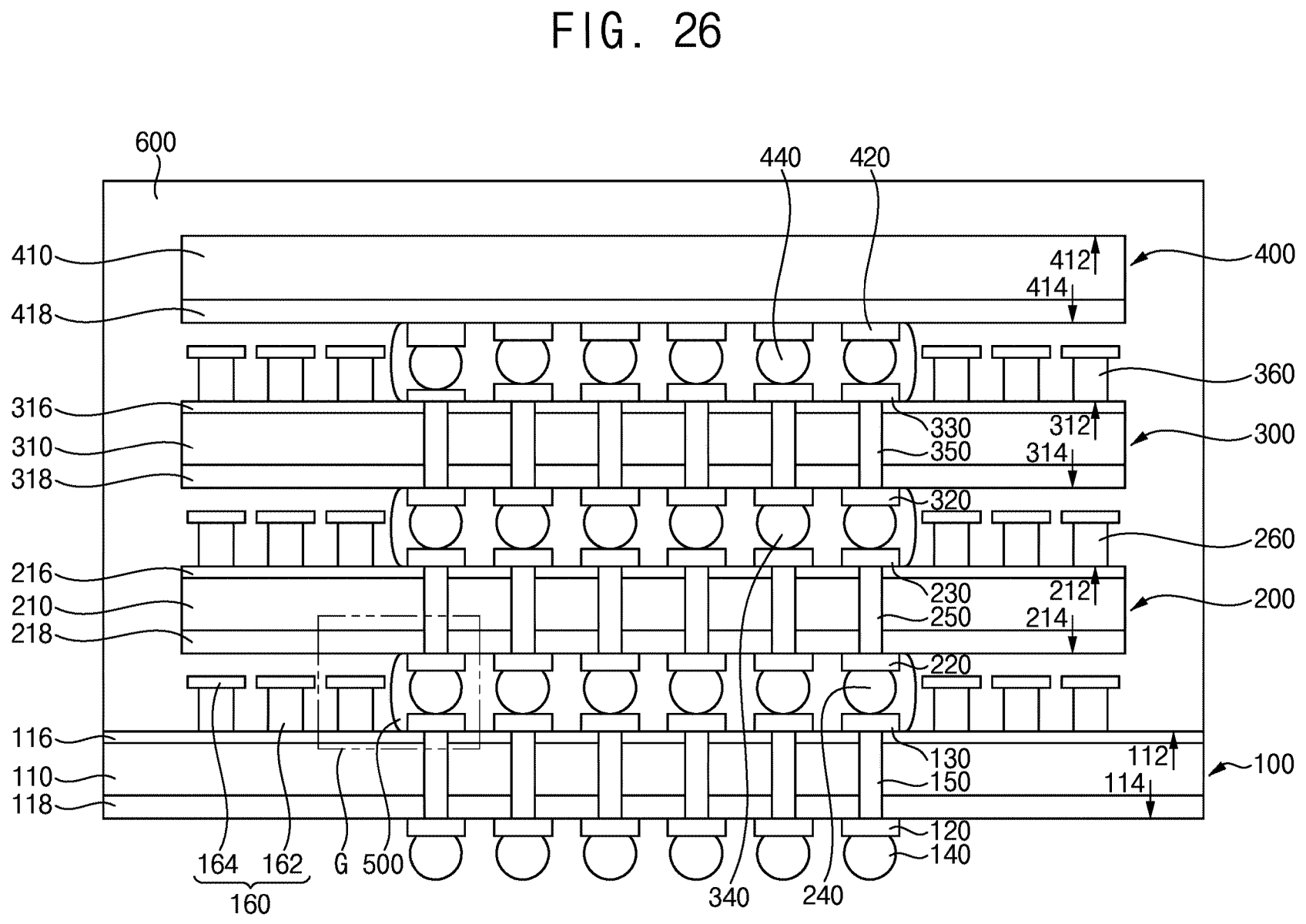

SEMICONDUCTOR PACKAGE INCLUDING STACKED CHIPS AND METHOD OF MANUFACTURING THE SEMICONDUCTOR PACKAGE

CROSS-REFERENCE TO RELATED APPLICATION

This application claims priority under 35 U.S.C. § 119 to Korean Patent Application No. 10-2022-0102512, filed on Aug. 17, 2022 in the Korean Intellectual Property Office (KIPO), the contents of which are herein incorporated by reference in their entirety.

TECHNICAL FIELD

The present disclosure relates to a semiconductor package and, more specifically, to a semiconductor package including a plurality of stacked chips and a method of manufacturing the same.

DISCUSSION OF THE RELATED ART

In a bonding process of stacking a plurality of semiconductor chips, a space between the stacked semiconductor chips may be filled with a non-conductive film (NCF). When the non-conductive film is not sufficiently dispersed between the semiconductor chips, voids may occur in corner regions between the semiconductor chips. The voids may cause a pressing phenomenon in the corner regions, and thus, warpage may occur in the stacked semiconductor chips.

SUMMARY

A semiconductor package includes a first semiconductor chip including a substrate having a first upper surface and a first lower surface opposite to the first upper surface. The substrate has a central region and corner regions around the central region. A plurality of through electrodes penetrates through the central region of the substrate. A bonding pad is electrically connected to the through electrode and has a first height from the first upper surface. A plurality of dummy pads respectively extend from the first upper surface on the corner regions of the substrate and having a second height that is higher than the first height. A second semiconductor chip has a second upper surface and a second lower surface opposite to the second upper surface. The second semiconductor chip is disposed on the first semiconductor chip via conductive bumps that are disposed on the second lower surface and are electrically connected to the bonding pads.

A semiconductor package includes a first semiconductor chip including a substrate having a first upper surface and a first lower surface opposite to the first upper surface. The substrate has a central region and edge regions around the central region. A plurality of through electrodes penetrate through the central region of the substrate. A bonding pad is electrically connected to the through electrode and has a first height from the first upper surface. A plurality of dummy pads respectively extend from the first upper surface on the edge regions of the substrate and having a second height that is higher than the first height. A second semiconductor chip has a second upper surface and a second lower surface opposite to the second upper surface. The second semiconductor chip is disposed on the first semiconductor chip via conductive bumps that are disposed on the second lower surface and are electrically connected to the bonding pads. An adhesive is configured to fill a space between the first and second semiconductors in the central region.

A semiconductor package includes a first semiconductor chip including a first substrate having a first upper surface and a first lower surface opposite to the first upper surface. A first through electrode extends through the first substrate in a vertical direction. A first bonding pad is disposed on the first through electrode and having a first height from the first upper surface. A plurality of first dummy pads respectively extends from the first upper surface and having a second height that is higher than the first height, in the vertical direction. A second semiconductor chip including a second substrate has a second upper surface and a second lower surface opposite to the second upper surface. A second through electrode extends through the second substrate in the vertical direction. A second bonding pad is disposed on the second through electrode and having a third height from the second upper surface. A second conductive bump is disposed on the second lower surface and is electrically connected to the first bonding pad. A plurality of second dummy pads respectively extend from the second upper surface and having a fourth height that is higher than the third height in the vertical direction. A third semiconductor chip has a third upper surface and a third lower surface opposite to the third upper surface. The third semiconductor chip is disposed on the second semiconductor chip through a third conductive bump disposed on the third lower surface and is electrically connected to the second bonding pad. An adhesive is configured to fill a space between the first to third semiconductors. The adhesive includes a non-conductive film (NCF) material.

A semiconductor package includes a first semiconductor chip including a substrate having a first upper surface and a first lower surface opposite to the first upper surface. The substrate has a central region and corner regions around the central region. A plurality of through electrodes pass through the central region of the substrate. A bonding pad electrically connects to the through electrode and has a first height from the first upper surface. A plurality of dummy pads respectively extend from the first upper surface on the corner regions of the substrate and having a second height that is higher than the first height. A second semiconductor chip has a second upper surface and a second lower surface opposite to the second upper surface. The second semiconductor chip is disposed on the first semiconductor chip through conductive bumps disposed on the second lower surface and is electrically connected to the bonding pads.

BRIEF DESCRIPTION OF THE DRAWINGS

Example embodiments will be more clearly understood from the following detailed description taken in conjunction with the accompanying drawings, wherein:

FIGS. 6 to 24 are views illustrating a method of manufacturing a semiconductor package in accordance with example embodiments;

FIG. 26 is a cross-sectional view taken along the line F-F' in FIG. 25.

DETAILED DESCRIPTION OF EXAMPLE EMBODIMENTS

Hereinafter, example embodiments will be explained in detail with reference to the accompanying drawings.

Figure 1:
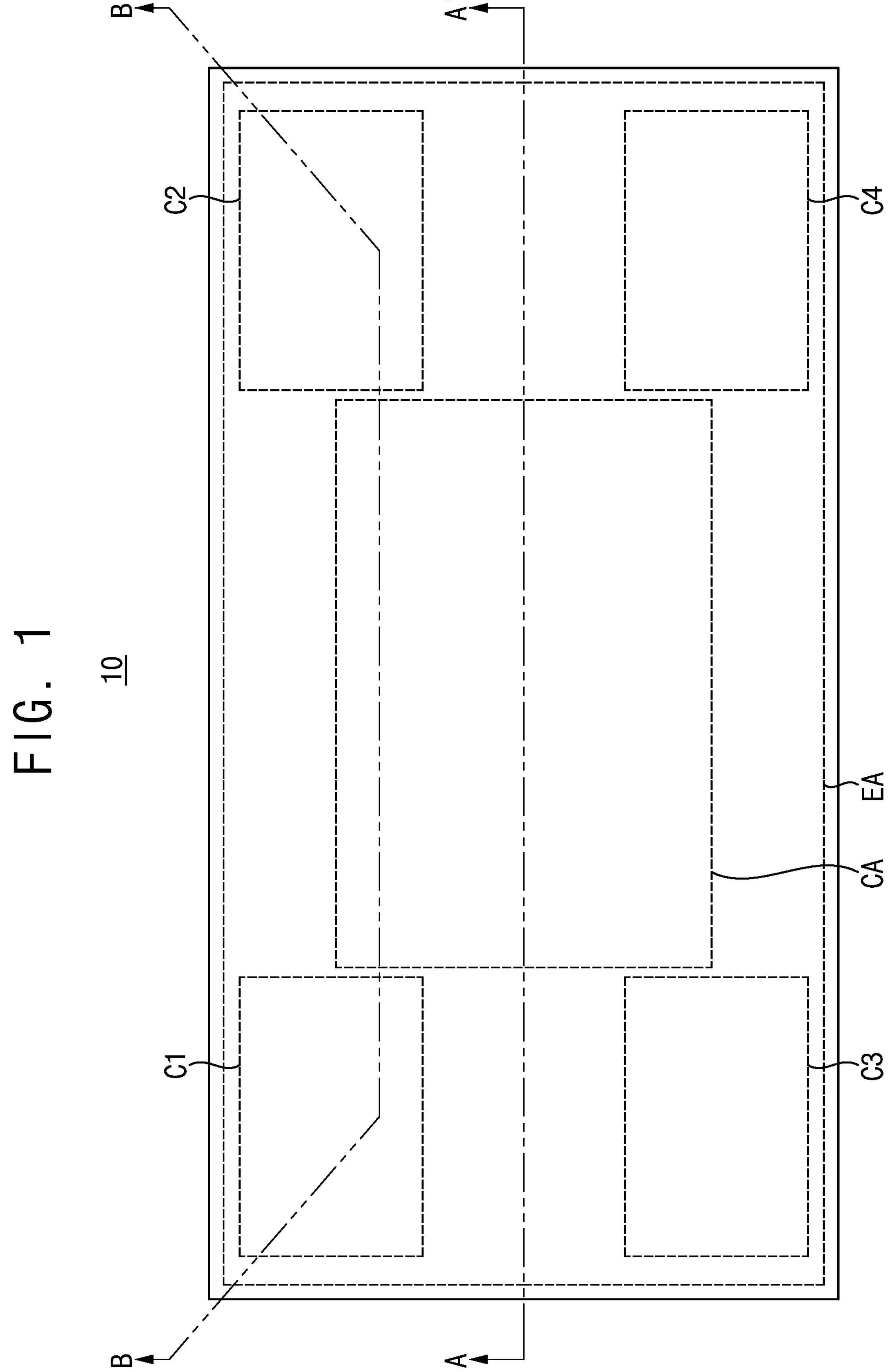
FIG. 1 is a plan view illustrating a semiconductor package in accordance with example embodiments.
Figure 2:
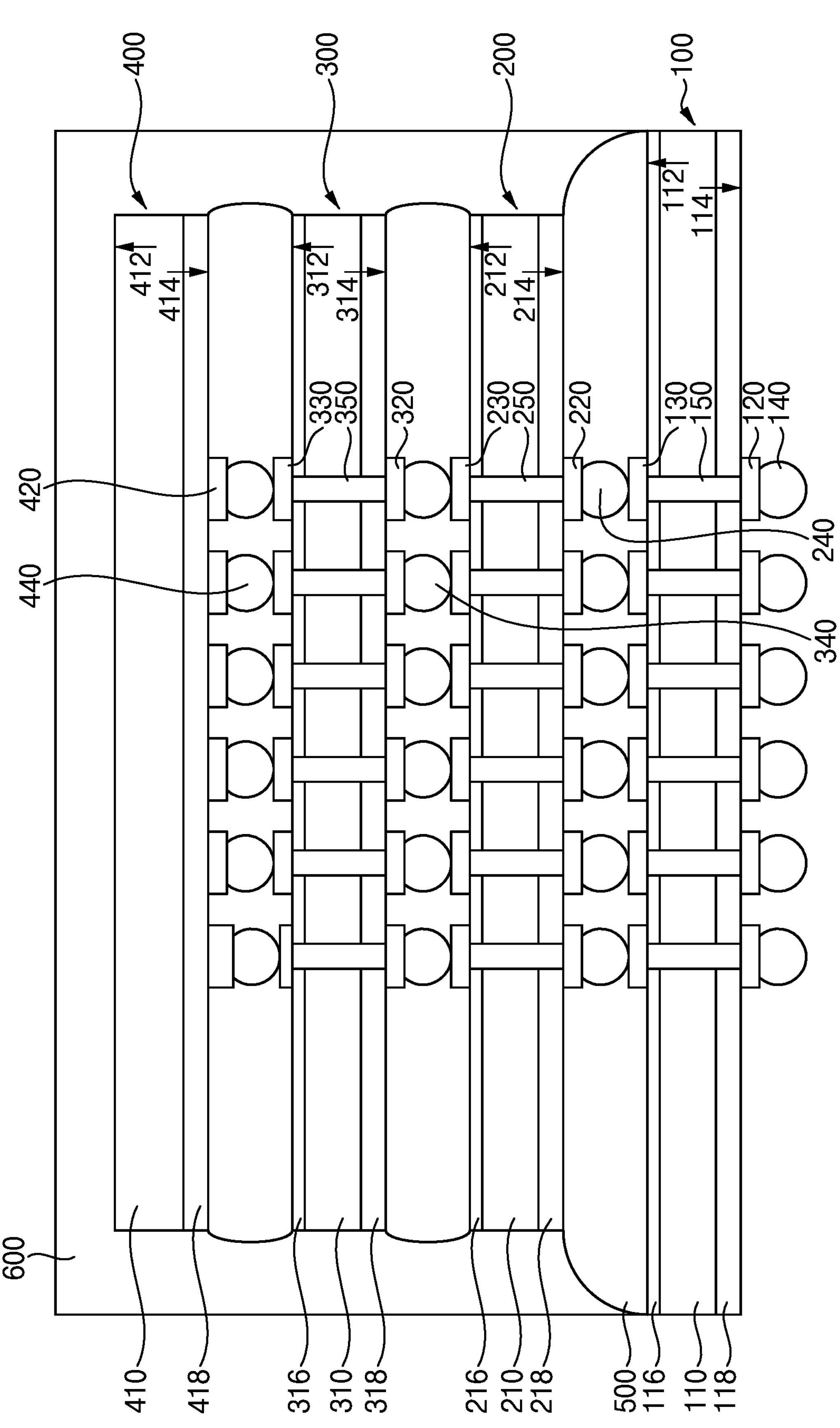
FIG. 2 is a cross-sectional view taken along the line A-A' in FIG. 1.
Figure 3:
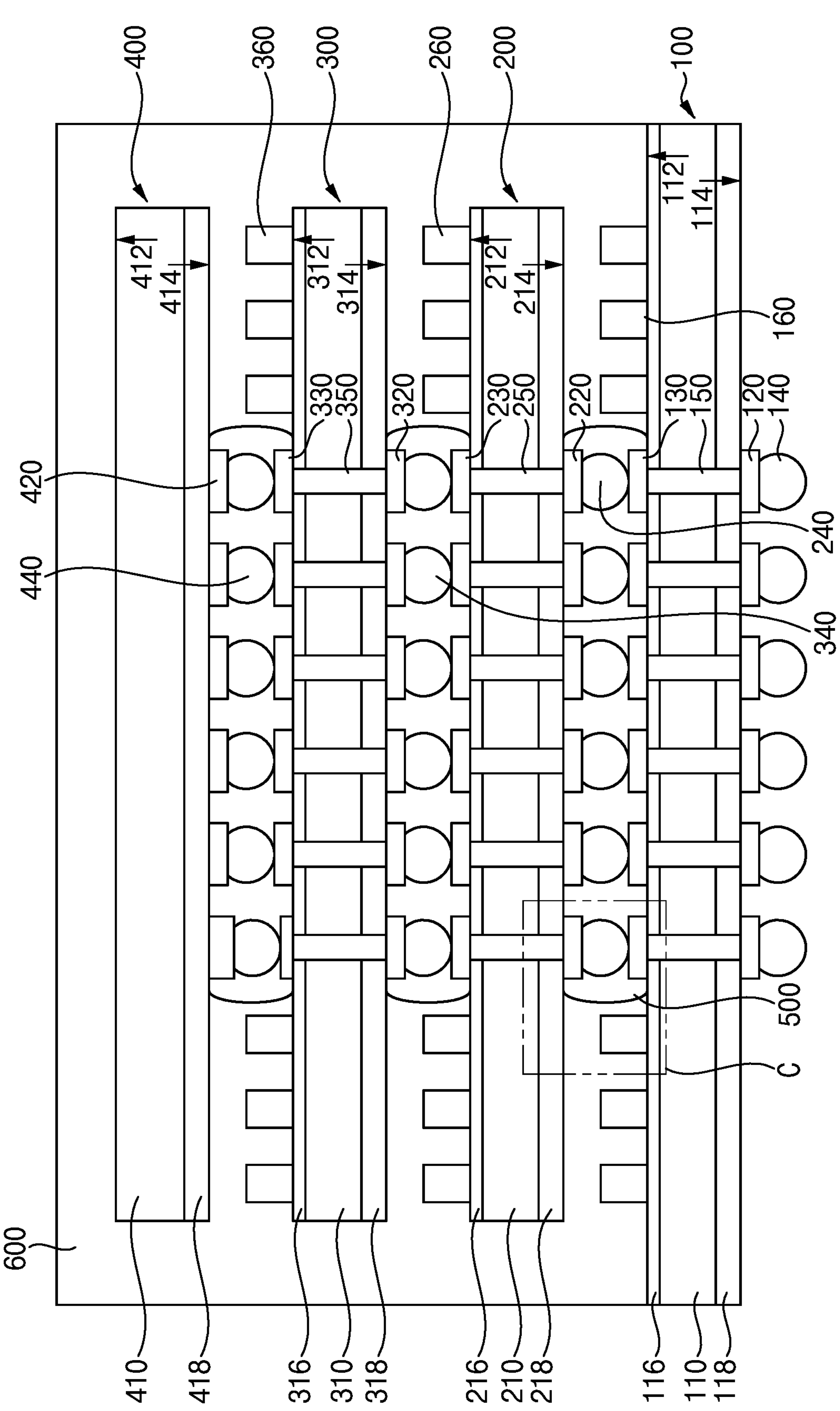
FIG. 3 is a cross-sectional view taken along the line B-B' in FIG. 1.
Figure 4:
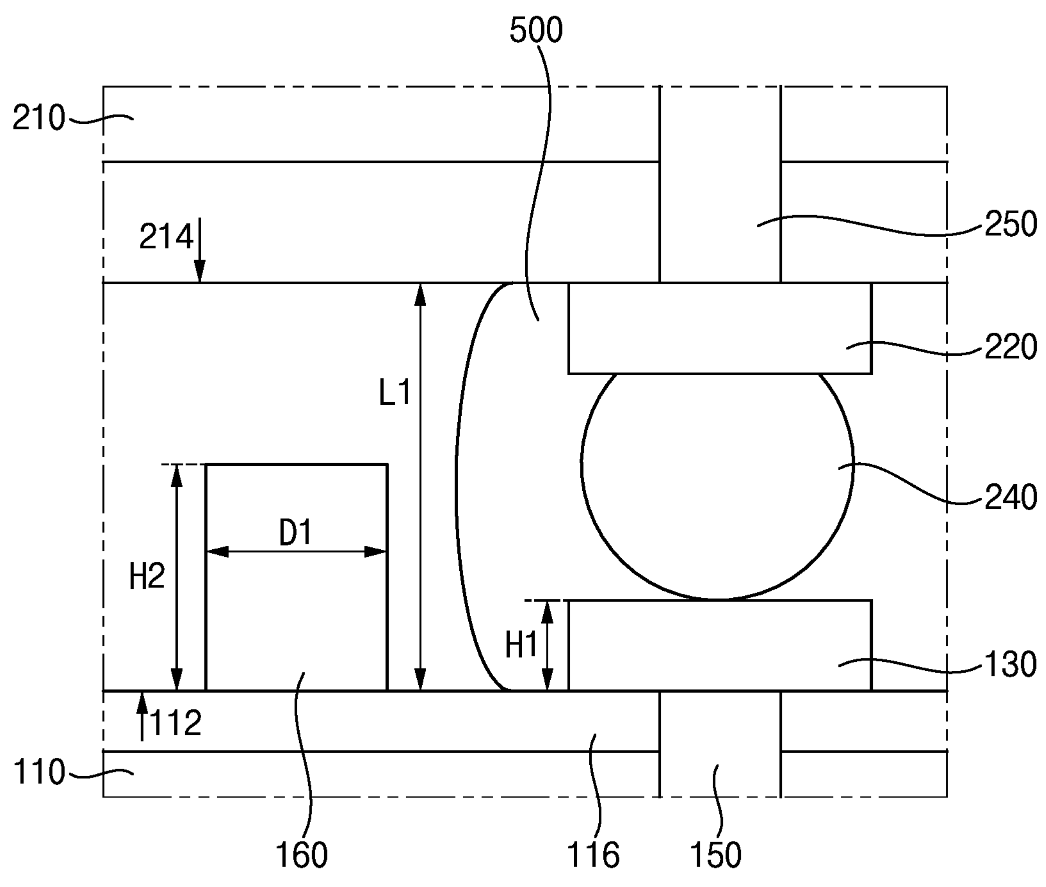
FIG. 4 is an enlarged cross-sectional view illustrating portion 'C' in FIG. 3.
Figure 5:
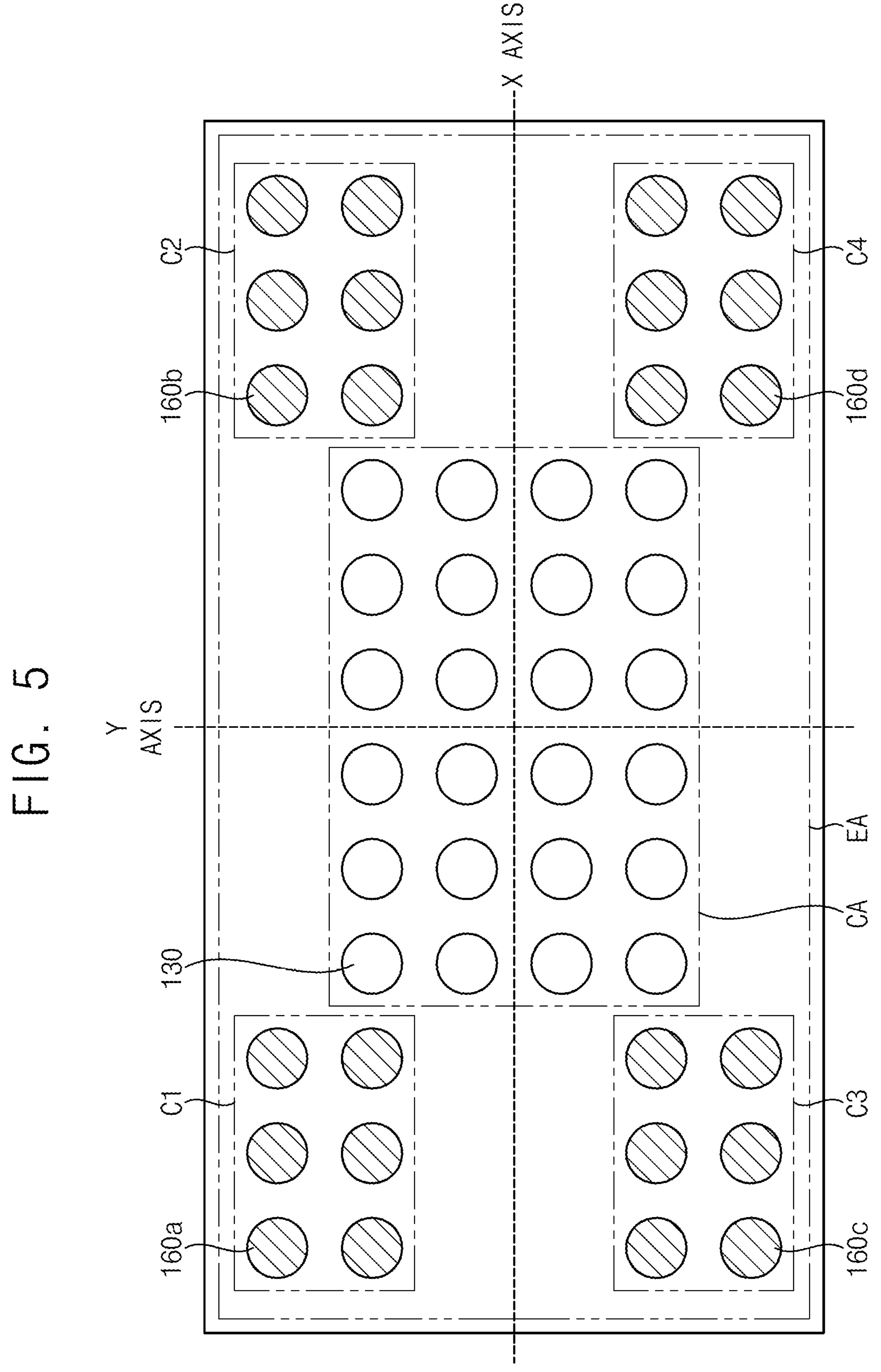
FIG. 5 is a plan view illustrating a first semiconductor chip in FIG. 3.

FIG. 1 is a plan view illustrating a semiconductor package in accordance with example embodiments. FIG. 2 is a cross-sectional view taken along the line A-A' in FIG. 1. FIG. 3 is a cross-sectional view taken along the line B-B' in FIG. 1. FIG. 4 is an enlarged cross-sectional view illustrating portion 'C' in FIG. 3. FIG. 5 is a plan view illustrating a first semiconductor chip in FIG. 3.

Referring to FIGS. 1 to 5, a semiconductor package 10 may include stacked semiconductor chips. The semiconductor package 10 may include stacked first to fourth semiconductor chips 100, 200, 300 and 400. The semiconductor package 10 may include an adhesive 500 filling a space between the stacked first to fourth semiconductor chips 100, 200, 300 and 400 and attaching them to each other.

The plurality of semiconductor chips 100, 200, 300, 400 may be vertically stacked. In this embodiment, the first to fourth semiconductor chips 100, 200, 300, 400 may be substantially the same as or similar to each other. Thus, same or similar components are denoted by the same or similar reference numerals, and to the extent that a description of such an element has been omitted, it may be understood that the element is at least similar to a corresponding element that has been described herein.

In this embodiment, it is exemplified that the semiconductor package as a multi-chip package includes four stacked semiconductor chips 100, 200, 300, 400. However, the present embodiment is not necessarily limited thereto, and for example, the semiconductor package may include 8, 12, or 16 stacked semiconductor chips.

Each of the first to fourth semiconductor chips 100, 200, 300, 400 may include an integrated circuit chip that is fabricated by performing semiconductor manufacturing processes. Each of the semiconductor chips may include, for example, a memory chip or a logic chip. The semiconductor package 10 may include a memory device. The memory device may include a high bandwidth memory (HBM) device.

Hereinafter, the first semiconductor chip 100 will be described first.

The first semiconductor chip 100 may include a first substrate 110 having a first upper surface 112 and a first lower surface 114 opposite to the first upper surface. A first connecting pad 120 is disposed on the first lower surface 114. A first bonding pad 130 is disposed on the first upper surface 112. A first conductive bump 140 is disposed on the first connecting pad 120. A first dummy pad 160 is disposed on the first upper surface 112. In addition, the first semiconductor chip 100 may further include a first through electrode 150 penetrating the first substrate 110 and a first protective layer 116 disposed on the first upper surface 112.

The first upper surface 112 of the first substrate 110 may be an inactive surface, and the first lower surface 114 may be an active surface. Circuit patterns may be disposed on the first lower surface 114 of the first substrate 110. The first lower surface 114 may be referred to as a front side surface on which the circuit patterns are formed, and the first upper surface 112 may be referred to as a backside surface.

The first substrate 110 may include a central region CA and an edge region EA at least partially surrounding the central region CA. The central region CA may be referred a region in which the first bonding pad 130, the first connecting pad 120, the first through electrode 150, and the first conductive bump 140 of the first semiconductor chip 100 are disposed.

For example, the first substrate 110 may include a semiconductor material such as silicon, germanium, or silicon-germanium. The first substrate 110 may include a III-V compound semiconductor such as gallium phosphide (GaP), gallium arsenide (GaAs), gallium antimonide (GaSb), or the like. In some embodiments, the first substrate 110 may be a silicon-on-insulator (SOI) substrate or a germanium-on-insulator (GOI) substrate.

The circuit patterns may include transistors, diodes, and the like. The circuit patterns may constitute circuit elements. Accordingly, the first semiconductor chip 100 may be a semiconductor device in which a plurality of circuit elements is formed.

In example embodiments, a first activation layer 118 may be disposed on the first lower surface 114 of the first substrate 110. The first activation layer 118 may include an insulating layer and a plurality of redistribution wirings disposed in the insulating layer. The redistribution wirings may be connected to one side of the first through electrode 150. The first connecting pad 120 may be connected to the redistribution wirings electrically connected to the first through electrode 150. The insulating layer may include silicon oxide, carbon-doped silicon oxide, silicon carbonitride (SiCN), or the like.

The first conductive bump 140 may be disposed on the first connecting pad 120. The first conductive bump 140 may provide an electrical movement path for electrically connecting the first semiconductor chip 100 to another semiconductor device. The first conductive bump 140 may mount the first semiconductor chip 100 on the other semiconductor device. For example, the first conductive bumps 140 may include micro bumps (μBump).

The first protective layer 116 may be disposed on the first upper surface 112 of the first substrate 110. The first protective layer 116 may be formed of an insulating material to protect the first substrate 110. The first protective layer 116 may be formed of an oxide film or a nitride film, or may be formed of a double layer of an oxide film and a nitride film. The first protective layer 116 may be formed of an oxide film, for example, a silicon oxide film ($SiO_2$) using a high-density plasma chemical vapor deposition (HDP-CVD) process.

The first bonding pad 130 may be formed on the first protective layer 116 and may be electrically connected to the first through electrode 150. The first bonding pad 130 may be electrically connected to the first through electrode 150 at the other side opposite to the one side of the first through electrode 150. The first bonding pad 130 may have a first height H1.

The first through electrode 150 may penetrate the first substrate 110 in a vertical direction. One end of the first through electrode 150 may be electrically connected to the redistribution wirings. The other end of the first through electrode 150 may be exposed to the first upper surface 112 of the first substrate 110. The first through electrode 150 may be electrically connected to the first bonding pad 130 through the other exposed end.

The first connecting pad 120, the first bonding pad 130, and the first through electrode 150 may include a same metal. For example, the metal may include copper (Cu), aluminum (Al), tungsten (W), nickel (Ni), molybdenum (Mo), gold (Au), silver (Ag), chromium (Cr), tin (Sn), and titanium (Ti). However, the present invention is not necessarily limited thereto, and may include a material capable of bonding by interdiffusion of metals by an annealing process at a high temperature.

In example embodiments, the second semiconductor chip 200 may include a second substrate 210, a second bonding pad 230 and a second dummy pad 260 disposed on a second upper surface 212 of the second substrate 210, a second connecting pad 220 disposed on a second lower surface 214 of the second substrate 210, and the second conductive bump 240 disposed on the second connecting pad 220. The second semiconductor chip 200 may further include a second through electrode 250 penetrating the second substrate 210 in the vertical direction and a second protective layer 216 disposed on the second upper surface 212. A second activation layer 218 may be disposed on the second lower surface 214 of the second substrate 210.

The second lower surface 214 of the second substrate 210 may face the first upper surface 112 of the first substrate 110. The second conductive bump 240 of the second semiconductor chip 200 may be directly bonded to the first bonding pad 130 of the first semiconductor chip 100. The second semiconductor chip 200 may be mounted on the first semiconductor chip 100 by a flip chip bonding method. The second connecting pad 220 of the second semiconductor chip 200 may be electrically connected to the first bonding pad 130 of the first semiconductor chip 100 by the second conductive bump 240. The second lower surface 214 may be referred to as a front side surface on which the circuit patterns are formed, and the second upper surface 212 may be referred to as a backside surface.

In example embodiments, the third semiconductor chip 300 may include a third substrate 310, a third bonding pad 330 and a third dummy pad 360 disposed on a third upper surface 312 of the third substrate 310, the third connecting pad 320 disposed on a third lower surface 314 of the third substrate 310, and the third conductive bump 340 disposed on the third connecting pad 320. The third lower surface 314 may be referred to as a front side surface on which the circuit patterns are formed, and the third upper surface 312 may be referred to as a backside surface. The third semiconductor chip 300 may further include a third through electrode 350 penetrating the third substrate 310 in the vertical direction and a third protective layer 316 disposed on the third upper surface 312. A third activation layer 318 may be disposed on the third lower surface 314 of the third substrate 310. The third semiconductor chip 300 may be mounted on the second semiconductor chip 200 by the flip chip bonding method.

The fourth semiconductor chip 400 may include a fourth substrate 410 and a fourth connecting pad 420 disposed on a fourth lower surface 414 of the fourth substrate 410. A fourth activation layer 418 may be disposed on the fourth lower surface 414 of the fourth substrate 410. The fourth lower surface 414 may be referred to as a front side surface on which the circuit patterns are formed, and the fourth upper surface 412 may be referred to as a backside surface. The fourth semiconductor chip 400 may include a fourth conductive bump 440 disposed on the fourth connecting pad 420. The fourth semiconductor chip 400 may be mounted on the third semiconductor chip 300 by the flip chip bonding method.

In example embodiments, the first semiconductor chip 100 may include a plurality of the first dummy pads 160 disposed on the first upper surface 112 of the first substrate 110. The first dummy pads 160 may support the second lower surface 214 of the second semiconductor chip 200 in a bonding process for connecting the first semiconductor chip 100 and the second semiconductor chip 200 to each other.

The first dummy pads 160 may respectively extend from the first upper surface 112 of the first substrate 110 in the vertical direction. The first dummy pad 160 may have a second height H2. The second height H2 of the first dummy pad 160 may be higher than the first height H1 of the first bonding pad 130. Since the second height H2 of the first dummy pad 160 is higher than the first height H1 of the first bonding pad 130, the first dummy pad 160 may support the second lower surface 214 of the second semiconductor chip 200 when the second semiconductor chip 200 is bent under force. For example, the second height H2 of the first dummy pad 160 may be within a range of 3 μm to 30 μm. A diameter D1 of the first dummy pad 160 may be within a range of 10 μm to 50 μm.

For example, the second height H2 of the first dummy pad 160 may be equal to the first distance L1 between the first upper surface 112 of the first semiconductor chip 100 and the second lower surface 214 of the second semiconductor chip 200. When the second height H2 and the first distance L1 are the same, the first dummy pad 160 may support the second lower surface 214 of the second semiconductor chip 200.

The first dummy pad 160 may include a cylindrical shape, a quadrilateral pole shape, an octagonal pole shape, or the like. The first dummy pad 160 may include a same material as the first connecting pad 120, the first bonding pad 130, and the first conductive bump 140. For example, the first dummy pad 160 may include copper (Cu), aluminum (Al), tungsten (W), nickel (Ni), molybdenum (Mo), gold (Au), silver (Ag), chromium (Cr), tin (Sn), and titanium (Ti).

As illustrated in FIG. 5, the first dummy pads 160 may be disposed in the edge region EA surrounding the central region CA on the first upper surface 112 of the first semiconductor chip 100. Since the second semiconductor chip 200 includes the second conductive bump 240 and the second through electrode 250 in the central region CA, the second semiconductor chip 200 may be bent in the vertical direction on the edge region EA where there is no supporting structure. The first dummy pads 160 may support the second lower surface 214 of the second semiconductor chip 200 in the edge region EA.

The first dummy pads 160 may be disposed in the first to fourth corner regions C1, C2, C3, C4 on the first upper surface 112 of the first semiconductor chip 100. The first to fourth corner regions may be disposed in vertex regions of the first semiconductor chip 100 in the edge region EA of the first semiconductor chip 100. The number of first dummy pads 160 disposed in each of the corner regions C1, C2, C3, C4 may be the same. For example, the number of the first dummy pads 160 disposed in each of the corner regions C1, C2, C3, C4 may be within a range of 10 to 100.

Arrangements of the first dummy pads 160 disposed in each of the corner regions C1, C2, C3, C4 may be symmetrical to each other. The first dummy pads 160 may uniformly distribute a force applied from the second lower surface 214 of the second semiconductor chip 200 through the symmetrical arrangement.

For example, the arrangement of the first dummy pads 160*a* in the first corner region C1 may be symmetrical with respect to the Y-axis with the first dummy pads 160*b* in the second corner region C2. The arrangement of the first dummy pads 160*a* in the first corner region C1 may be symmetrical with respect to the X-axis with the third dummy pads 160*c* in the third corner region C3. The arrangement of the first dummy pads 160*b* in the second corner region C2 may be symmetrical with respect to the X-axis with the first dummy pads 160*d* in the fourth corner region C4. The arrangement of the third dummy pads 160*c* in the third corner region C3 may be symmetric with respect to the Y-axis with the first dummy pads 160*d* in the fourth corner region C4.

Similarly, the second and third semiconductor chips 200, 300 may also include second and third dummy pads 260, 360 in the edge region of the upper surface, respectively.

In example embodiments, the second semiconductor chip 200 may include second dummy pads 260 formed on the edge regions of the second upper surface 212 of the second substrate 210. The second dummy pads 260 may support the third lower surface 314 of the third semiconductor chip 300 in a bonding process of connecting the second semiconductor chip 200 and the third semiconductor chip 300 mounted on the second semiconductor chip 200 to each other.

The second dummy pads 260 may be disposed between the third lower surface 314 of the third substrate 310 and the second upper surface 212 of the second substrate 210. The second dummy pads 260 may be disposed in the edge region EA surrounding the central region CA on the second upper surface 212 of the second semiconductor chip 200. For example, the second dummy pads 260 may be disposed on the same axis as the first dummy pads 160 in the vertical direction.

In example embodiments, the third semiconductor chip 300 may include third dummy pads 360 formed on the edge regions of the third upper surface 312 of the third substrate 310. The third dummy pads 360 may support the fourth lower surface 414 of the fourth semiconductor chip 400 in a bonding process of connecting the third semiconductor chip 300 and the fourth semiconductor chip 400 mounted on the third semiconductor chip 300 to each other.

The third dummy pads 360 may be disposed between the fourth lower surface 414 of the fourth substrate 410 and the third upper surface 312 of the third substrate 310. The third dummy pads 360 may be disposed in the edge region EA surrounding the central region CA on the third upper surface 312 of the third semiconductor chip 300. For example, the third dummy pads 360 may be disposed on the same axis as the second dummy pads 260 in the vertical direction.

In example embodiments, the semiconductor package 10 may further include an adhesive 500 for attaching the first to fourth semiconductor chips 100, 200, 300, 400 to each other. The adhesive 500 may fill spaces between the first to fourth semiconductor chips 100, 200, 300, 400. For example, the adhesive 500 may include a non-conductive film (NCF) material.

Since the adhesive 500 is dispersed from the central region CA to the edge region EA, the first to fourth corner regions C1, C2, C3, C4 might not be sufficiently coated. The first to fourth semiconductor chips 100, 200, 300, 400 might not be supported by the adhesive 500 in the uncoated first to fourth corner regions C1, C2, C3, C4. The first to third dummy pads 160, 260, 360 may support the second to fourth semiconductor chips 200, 300, 400 in the first to fourth corner regions C1, C2, C3, C4 so that the adhesive 500 does not spread.

In example embodiments, the semiconductor package 10 may further include a seal 600 covering the second, third, and fourth semiconductor chips 200, 300, 400 on the first semiconductor chip 100. The seal 600 may cover side surfaces of the second, third, and fourth semiconductor chips 200, 300, 400. The seal 600 may cover an upper surface of the fourth semiconductor chip 400. For example, the seal 600 may include a thermosetting resin or the like.

As described above, Since the second height H2 of the first dummy pad 160 is higher than the first height H1 of the first bonding pad 130 that electrically connects the first and second semiconductor chips 100, 200. The first dummy pads 160 may support between the first and second semiconductor chips 100, 200. Similarly, the second dummy pads 260 may support between the second and third semiconductor chips 200, 300, and the third dummy pads 360 may support between the third and fourth semiconductor chips 300, 400. As the first to third dummy pads 160, 260, 360 are disposed in corner regions C1, C2, C3, C4 between the first to fourth semiconductor chips 100, 200, 300, 400, the first to third dummy pads 160, 260, 360 may prevent the second and third semiconductor chips 200, 300 from a pressure generated in the corner regions C1, C2, C3, C4 that the non-conductive film (NCF) material cannot reach.

Hereinafter, a method of manufacturing the semiconductor package of FIG. 1 will be described.

Figure 20:
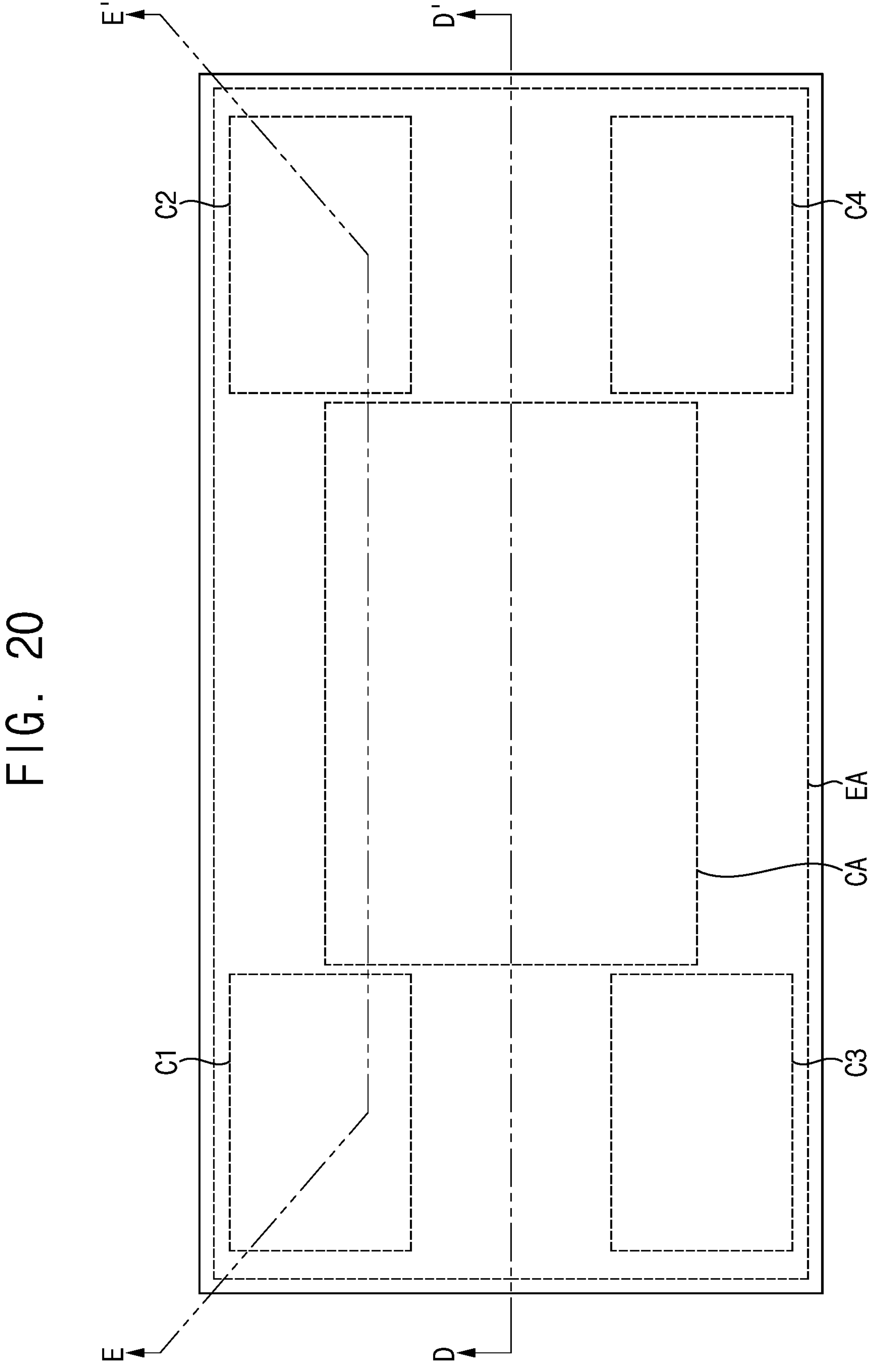
Figure 21:
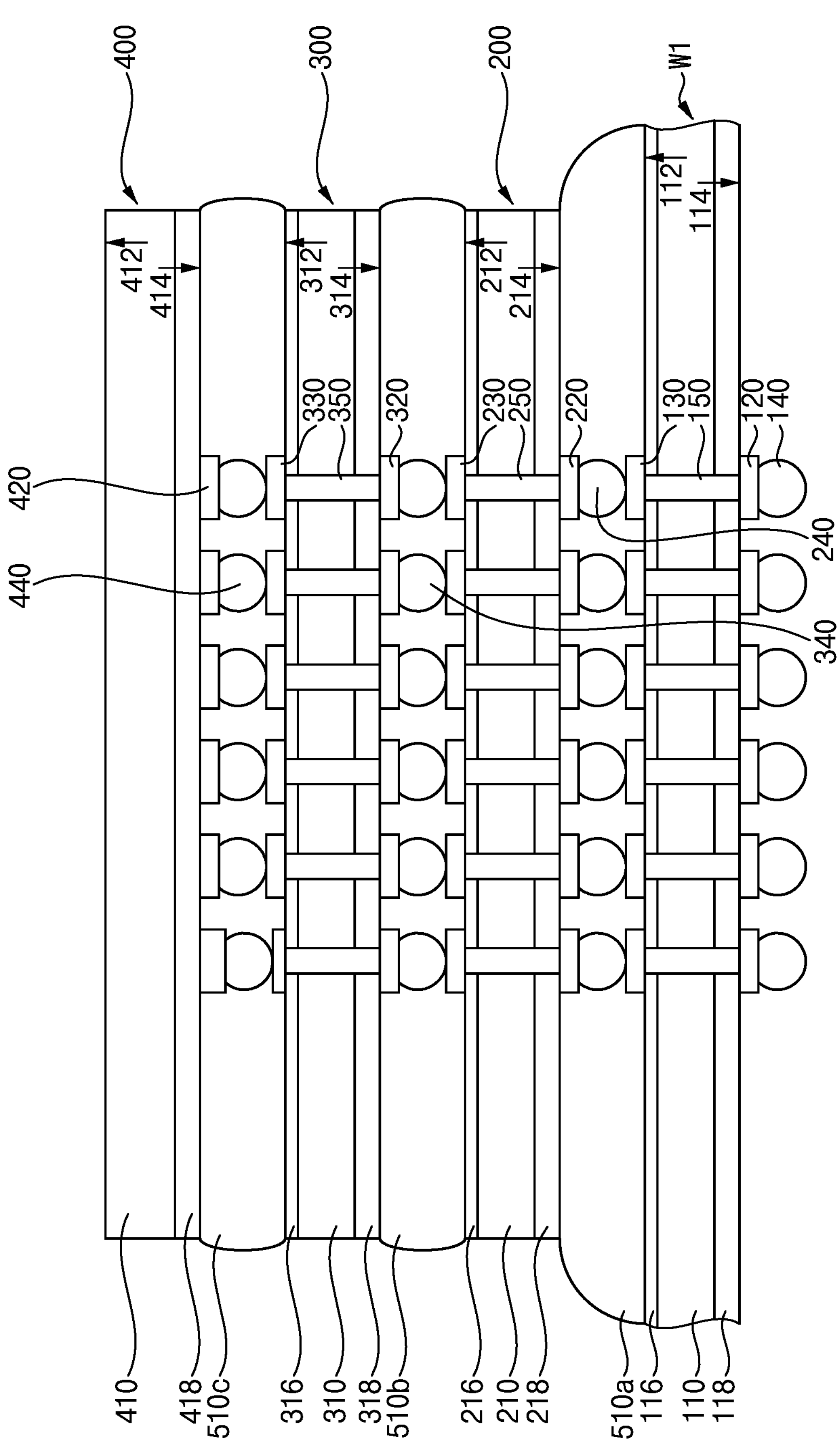
Figure 22:
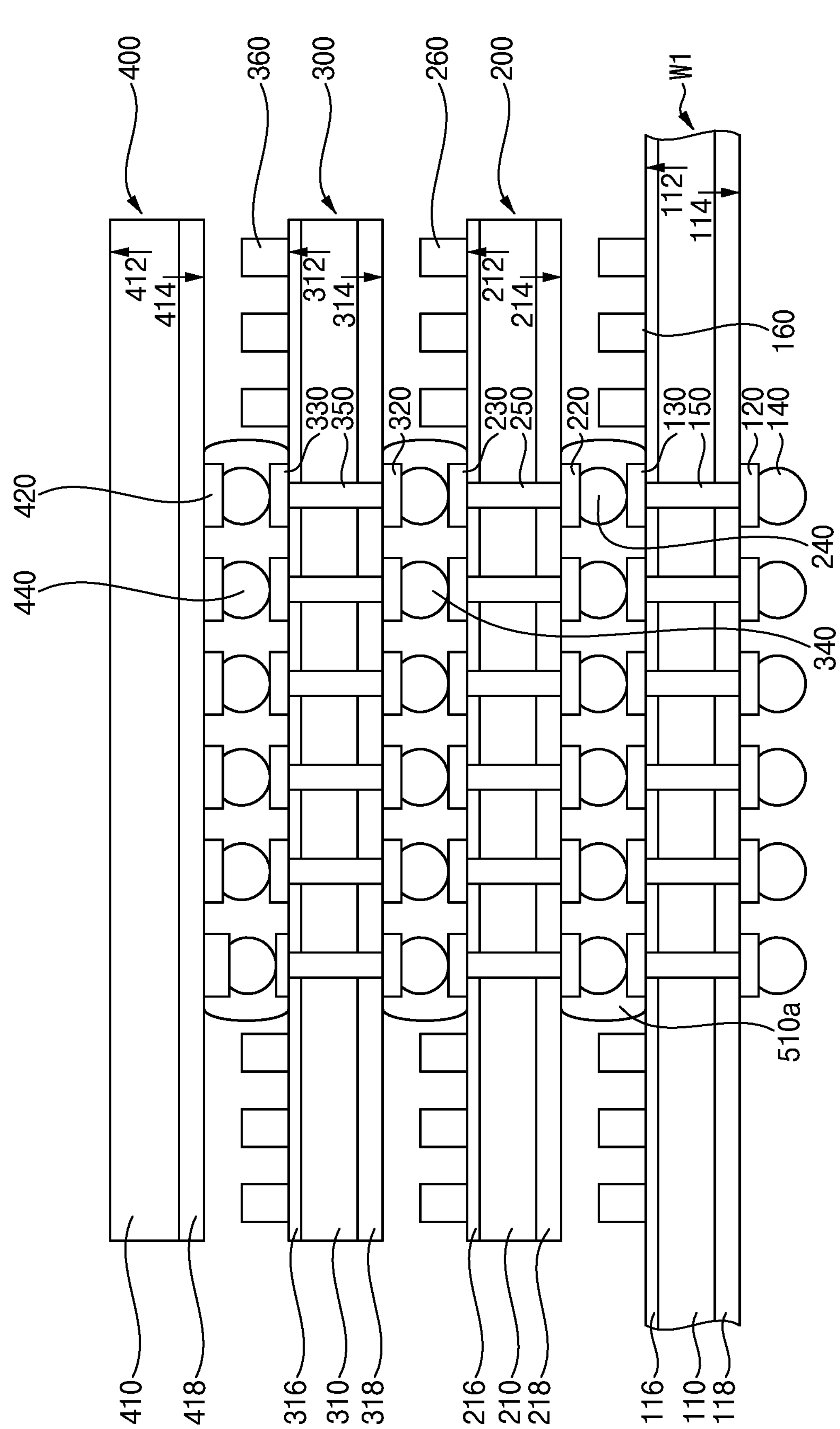

FIGS. 6 to 24 are views illustrating a method of manufacturing a semiconductor package in accordance with example embodiments. FIG. 16 is a plan view illustrating a second wafer in FIG. 15. FIG. 20 is a plan view illustrating a stacked semiconductor package. FIG. 21 is a cross-sectional view taken along the line D-D' in FIG. 20. FIG. 22 is a cross-sectional view taken along the line E-E' in FIG. 20.

Figure 6:
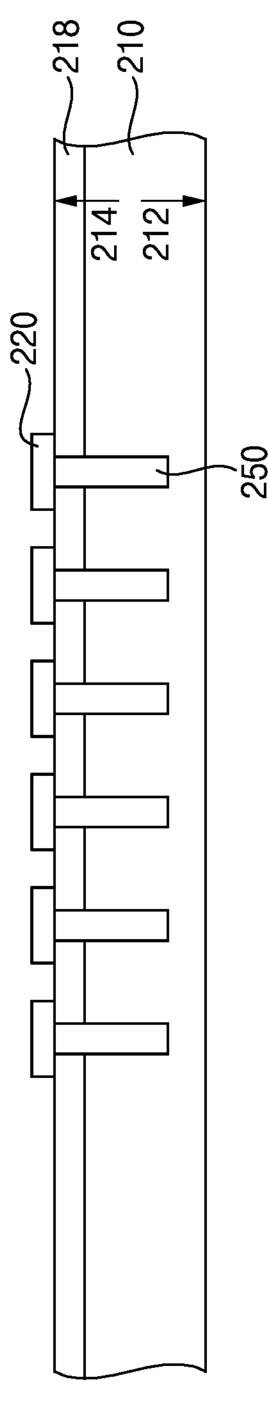

Referring to FIG. 6, first, a second wafer W2 on which a plurality of second semiconductor chips (dies) are formed may be prepared.

In example embodiments, the second wafer W2 may include a second substrate 210, a second through electrode 250 partially penetrating the second substrate 210, and a second connecting pad 220 disposed on the second through electrode 250.

For example, the second substrate 210 may include a semiconductor material such as silicon, germanium, or silicon-germanium. The second substrate 210 may include a III-V compound semiconductor such as gallium phosphide (GaP), gallium arsenide (GaAs), gallium antimonide (GaSb), or the like. According to some embodiments, the second substrate 210 may be a silicon-on-insulator (SOI) substrate or a germanium-on-insulator (GOI) substrate.

The second substrate 210 may have a second upper surface 212 and a second lower surface 214 opposite to the second upper surface 212. A second activation layer 218 may be disposed on the second lower surface 214 of the second substrate 210. The second activation layer 218 may include an insulating layer and a plurality of redistribution wirings disposed in the insulating layer. The redistribution wirings may be connected to one side of the second through electrode 250. Circuit patterns may be formed on the second activation layer 218.

The second substrate 210 may include a die region in which the circuit patterns and cells are formed and a scribe lane region surrounding the die region. The second substrate 210 may be individualized by cutting along the scribe lane region that separates the plurality of die regions of the second wafer W2 by a subsequent sawing process.

The circuit patterns may include transistors, capacitors, diodes, and the like. The circuit patterns may constitute circuit elements. Accordingly, the second semiconductor chip may be a semiconductor device having a plurality of circuit elements formed therein. The circuit patterns may be formed by performing a Front End of Line (FEOL) process for manufacturing the semiconductor device on the second lower surface 214 of the second substrate 210. A surface of the second substrate on which the FEOL process is performed may be referred to as a front side surface of the second substrate, and a surface opposite to the front surface may be referred to as a backside surface.

Referring to FIGS. 7 to 10, a second protective layer 216 may be formed on the second upper surface 212 of the second wafer W2.

Figure 7:
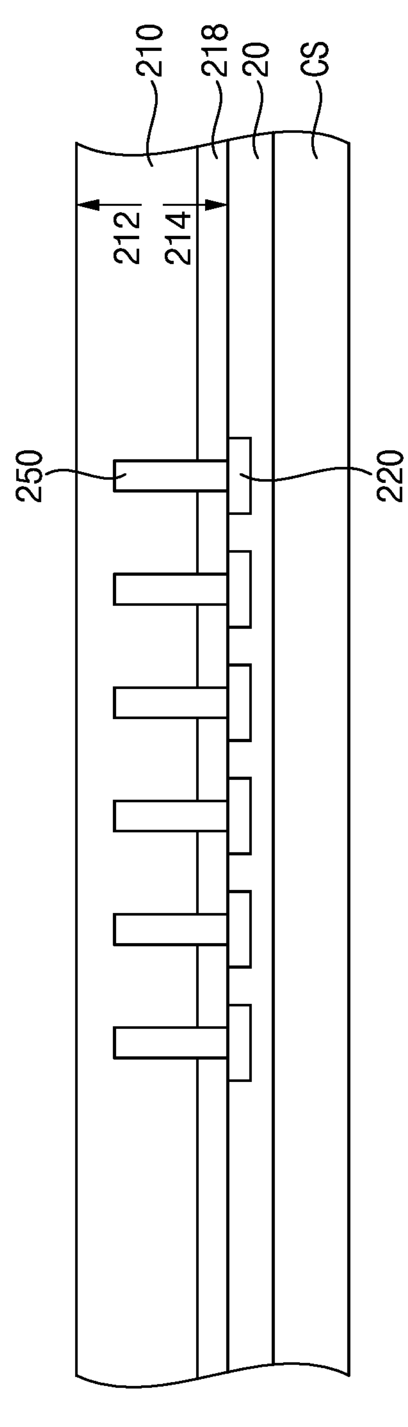
Figure 8:
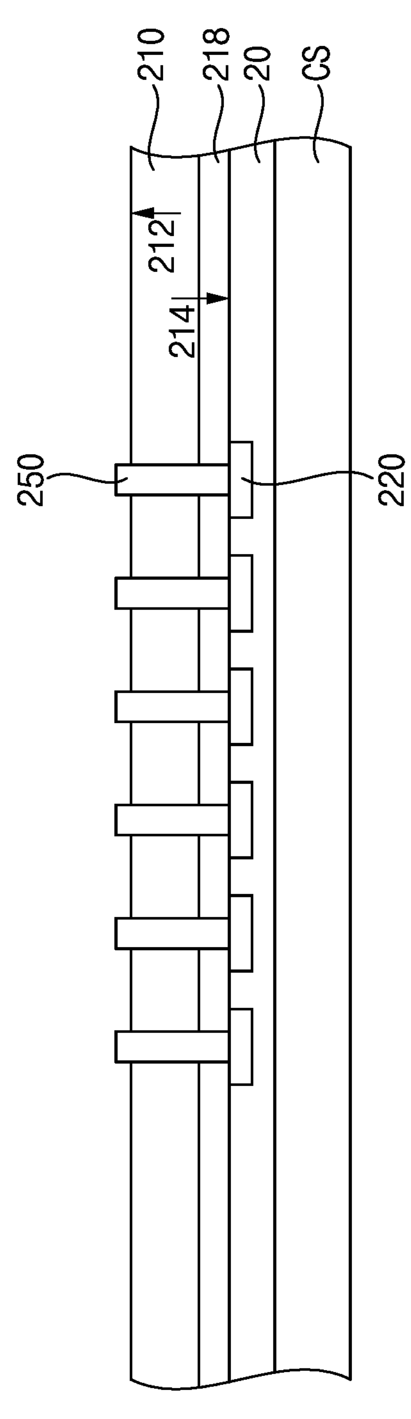

As illustrated in FIGS. 7 and 8, the second upper surface 212 of the second substrate 210 may be polished using a substrate support system (WSS). After attaching the second wafer W2 on a carrier substrate CS through an adhesive film 20, the second upper surface 212 of the second substrate 210 may be removed until a portion of the second through electrode 250 is exposed.

The second upper surface 212 of the second substrate 210 may be partially removed by a grinding process such as a chemical mechanical polishing (CMP) process. Accordingly, a thickness of the second substrate 210 may be reduced to a desired thickness. One end of the second through electrode 250 may be exposed from the second upper surface 212 of the second substrate 210. The one end of the second through electrode 250 may protrude from the second upper surface 212 of the second substrate 210.

Figure 9:
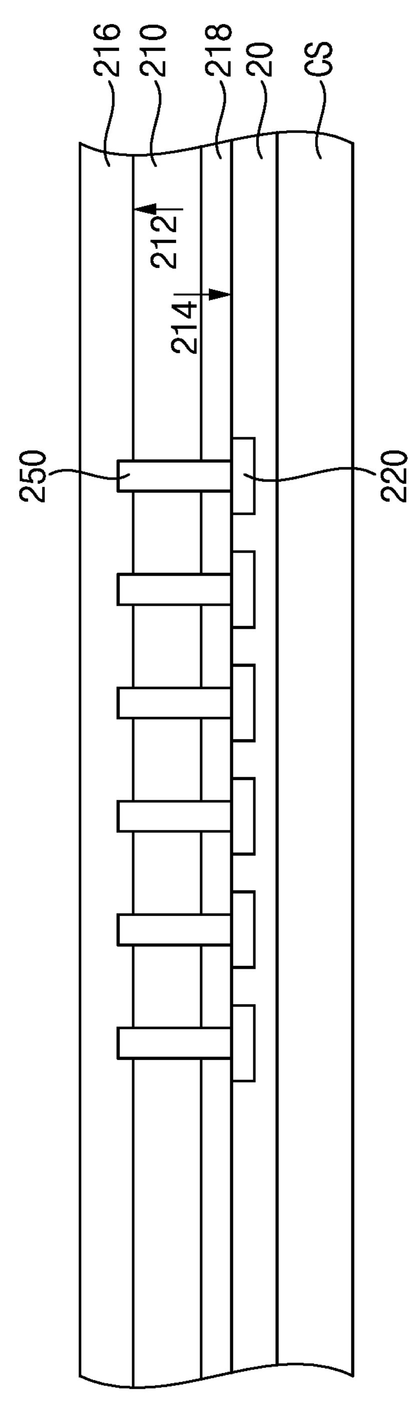

As illustrated in FIG. 9, a second protective layer 216 covering the second through electrode 250 protruding from the second upper surface 212 of the second substrate 210 may be formed.

Figure 10:
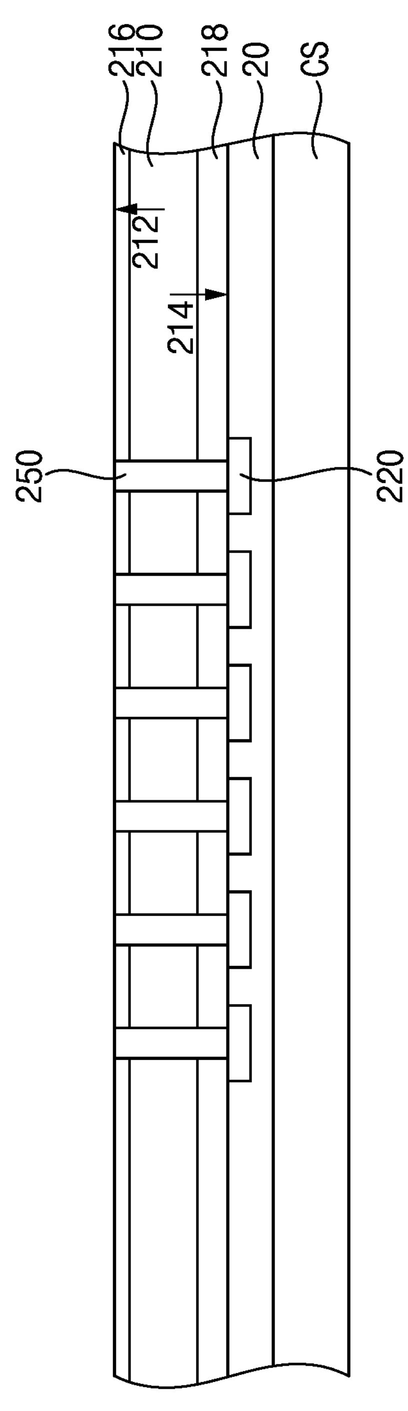

As illustrated in FIG. 10, the second protective layer 216 may be polished. The second upper surface 212 of the second substrate 210 may be removed until a portion of the second through electrode 250 is exposed. The second protective layer 216 may be partially removed by the grinding process. One end of the second through electrode 250 may be exposed from the second protective layer 216.

Referring to FIGS. 11 to 16, second bonding pads 230 electrically connected to the second through electrode 250 on the second upper surface 212 of the second substrate 210, and a second dummy pad 260 may be formed.

Figure 11:
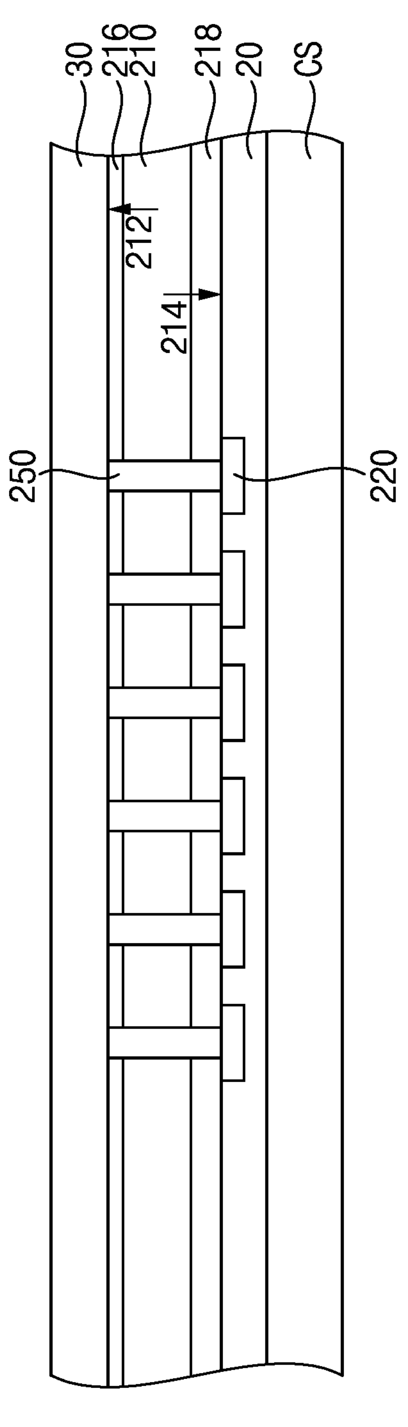
Figure 11:

As illustrated in FIG. 11, a photoresist layer 30 may be formed on the second upper surface 212 of the second wafer W2. The photoresist layer 30 may cover the second protective layer 216 and the one end of the second through electrode 250.

Figure 12:
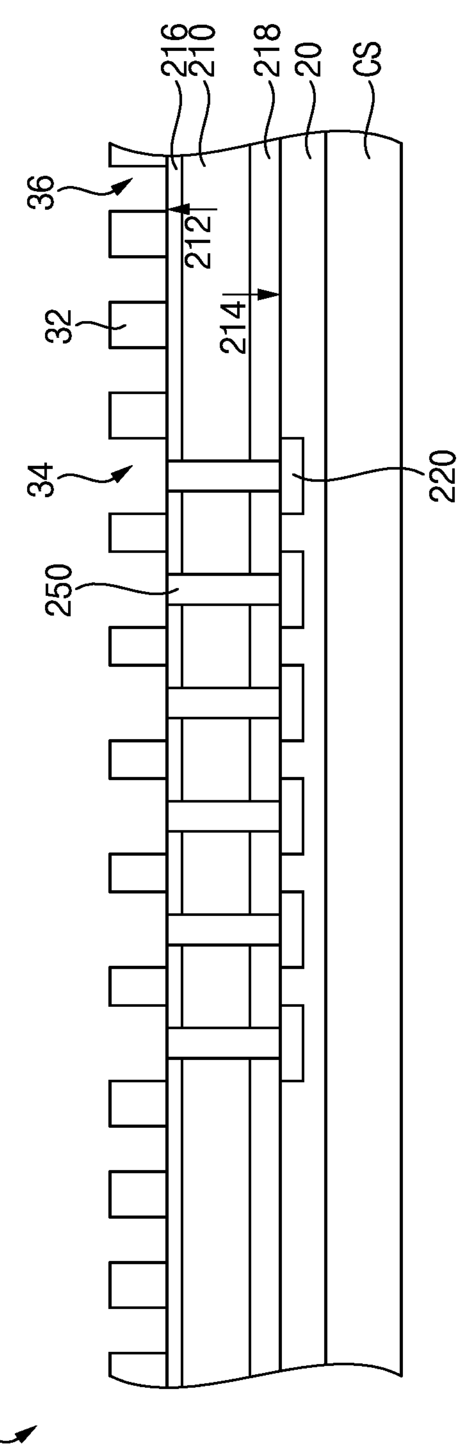

Then, as illustrated in FIG. 12, a photoresist pattern 32 having a first opening 34 exposing a second bonding pad region and a second opening 36 exposing a second dummy pad region may be formed by performing an exposure process on the photoresist layer 30. For example, a diameter of the second opening 36 may be within a range of 10 μm to 50 μm.

Figure 13:
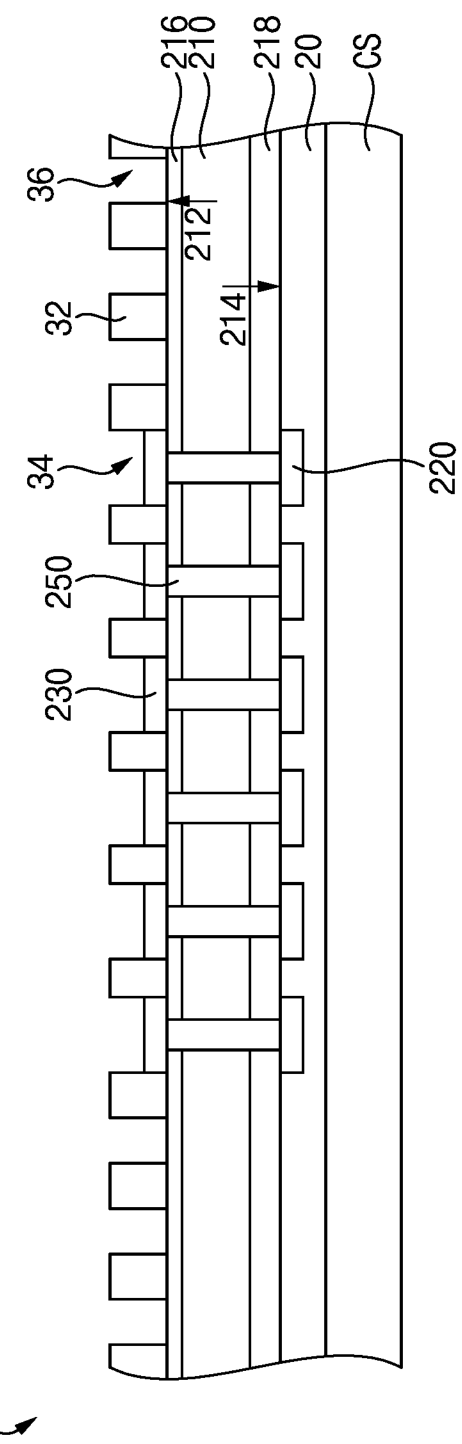

Then, as illustrated in FIG. 13, the second bonding pads 230 may be formed by a first plating process performed in the first opening 34 on the second protective layer 216. The first bonding pad 130 may have a first height H1 in the first opening 34. The first height H1 from the second upper surface 212 may be lower than an upper surface of the photoresist pattern 32.

Figure 14:
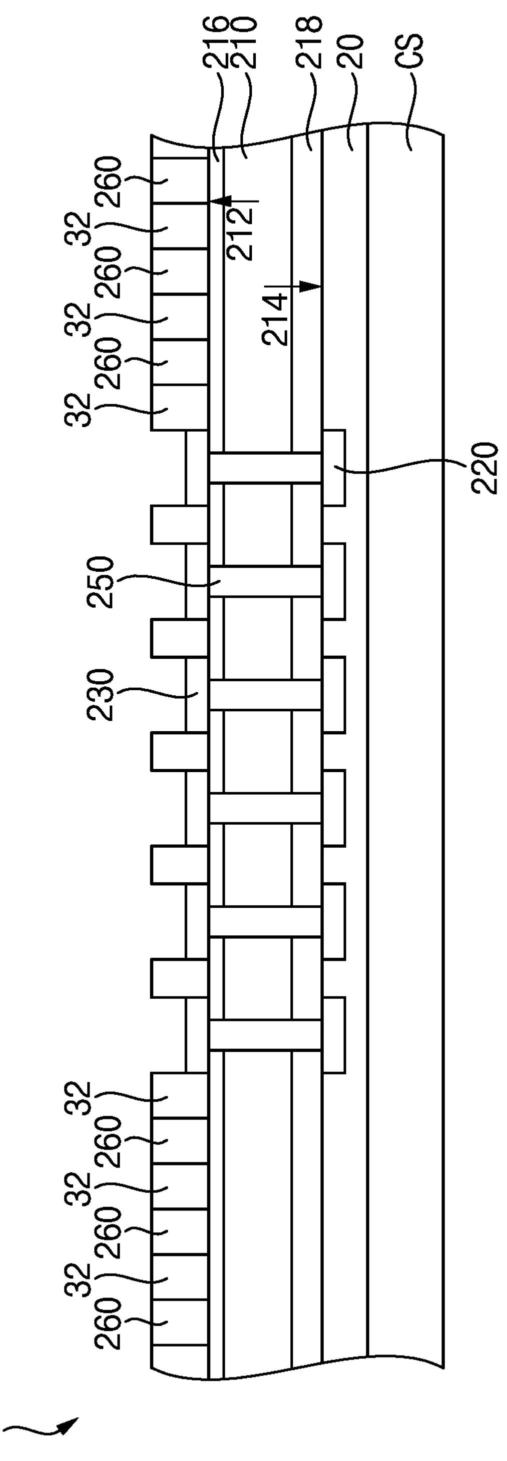

Then, as illustrated in FIG. 14, the second dummy pads 260 may be formed by a second plating process performed in the second opening 36 on the second protective layer 216. The first dummy pad 160 may have a second height H2 in the second opening 36. The second height H2 of the first dummy pad 160 may be higher than the first height H1 of the second bonding pad 230. The first and second plating processes may include an electrolytic plating process or an electroless plating process.

For example, the second bonding pad 230 and the second dummy pad 260 may include copper (Cu), aluminum (Al), tungsten (W), nickel (Ni), molybdenum (Mo), gold (Au), silver (Ag), chromium (Cr), tin (Sn), and titanium (Ti).

Figure 15:
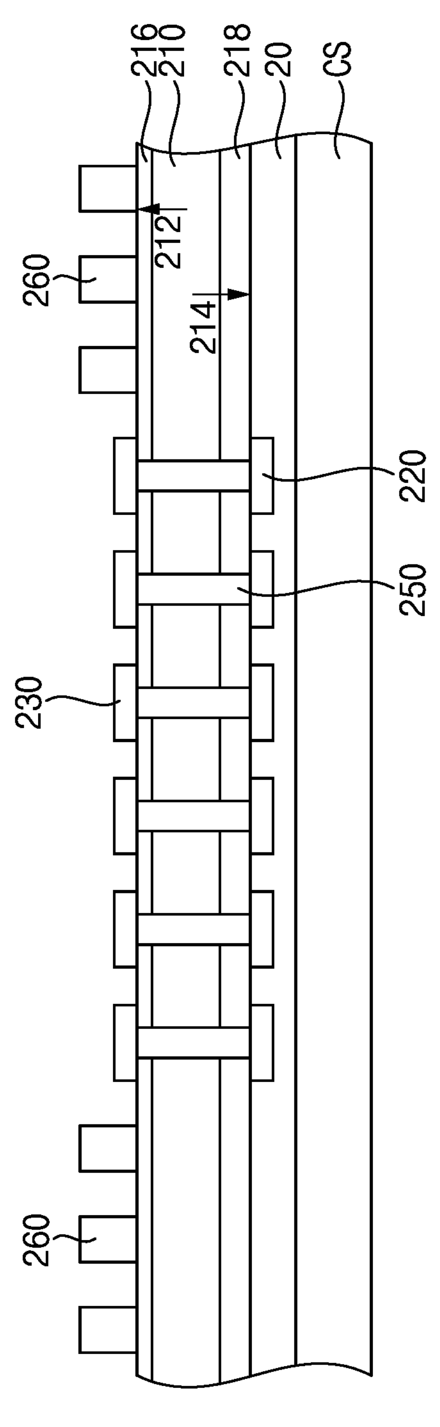
Figure 16:
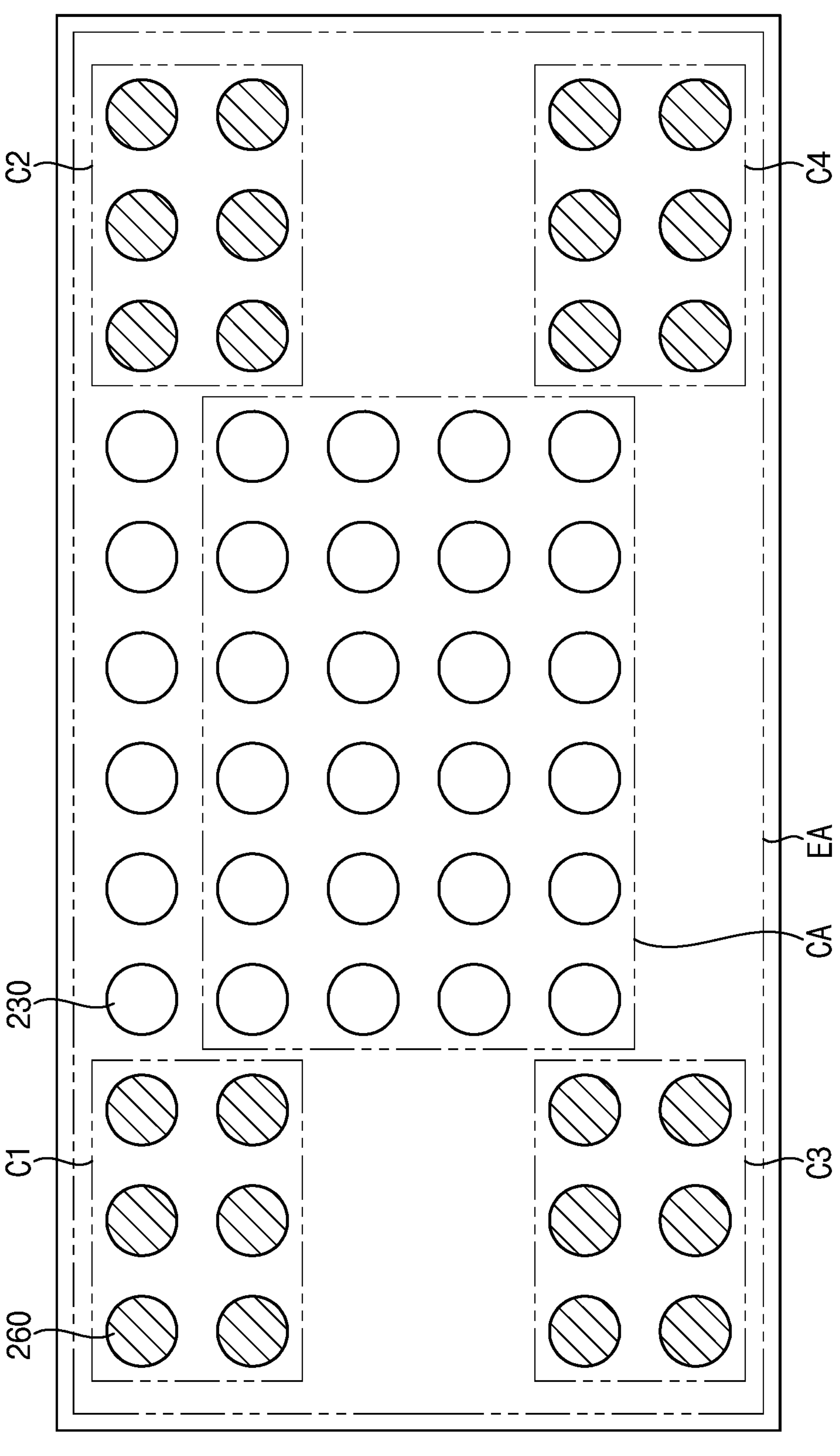

As illustrated in FIGS. 15 and 16, the second bonding pad 230 and the second dummy pad 260 may be formed on the second upper surface 212 of the second substrate 210 by removing the photoresist pattern 32.

The second dummy pads 260 may be formed in an edge region EA surrounding a central region CA on the second upper surface 212 of the second substrate 210. The second dummy pads 260 may be formed in first to fourth corner regions C1, C2, C3, C4 on the second upper surface 212 of the second substrate 210. The first to fourth corner regions may be formed in vertex regions of the second substrate 210 in the edge region EA of the second substrate 210. An arrangement of the second dummy pads 260 disposed in each of the corner regions C1, C2, C3, C4 may be symmetrical with respect to each other.

Figure 17:
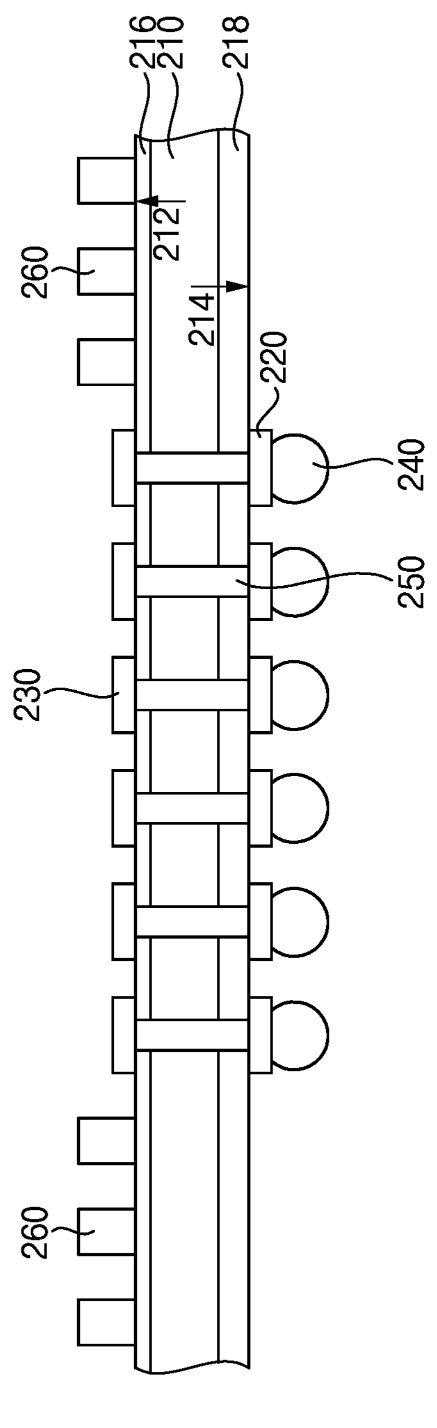

Referring to FIG. 17, second conductive bumps 240 may be formed on the second connecting pads 220.

The second conductive bump 240 may be formed on the second connecting pad 220. For example, after filling a temporary opening of a photoresist pattern with a conductive material, the photoresist pattern may be removed and a reflow process may be performed to form the second conductive bump 240. For example, the conductive material may be formed by a plating process. Alternatively, the second conductive bump 240 may be formed by a screen printing method, a deposition method, or the like. For example, the second conductive bump 240 may include a C4 bump.

Figure 18:
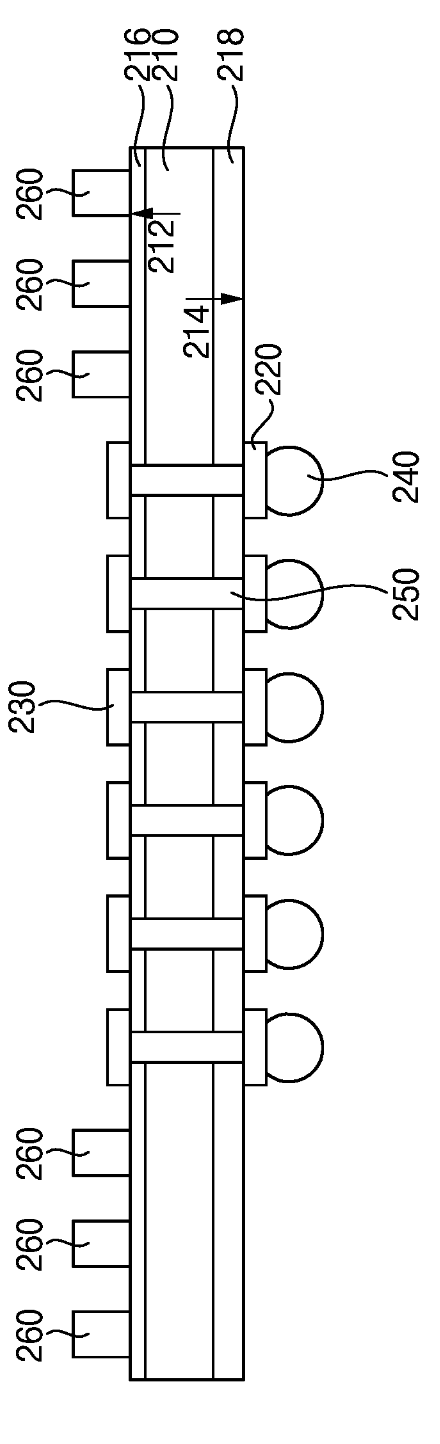

Referring to FIG. 18, the individual second semiconductor chip 200 may be formed by cutting the second wafer W2 along a scribe lane region. The second wafer W2 may be cut by a sawing process.

Referring to FIGS. 19 to 22, the second semiconductor chip 200 may be attached on a first wafer W1. A third semiconductor chip 300 manufactured through the same process as that of the second semiconductor chip 200 may be attached to the second semiconductor chip 200. A fourth semiconductor chip 400 may be attached on the third semiconductor chip 300. The second to fourth semiconductor chips 200, 300, 400 may be attached to the first wafer W1 through flip chip bonding.

In example embodiments, the second semiconductor chips 200 may be disposed on the first wafer W1 to correspond to the die regions. The second lower surface 214 of the second substrate 210 of the second semiconductor chip 200 may face the first wafer W1.

The second semiconductor chip 200 may be attached to the first upper surface 112 of the first wafer W1 by performing a thermal compression process at a predetermined temperature (e.g., about 400° C. or less). The second semiconductor chip 200 and the first wafer W1 may be bonded to each other by the thermal compression process. For example, the second conductive bumps 240 of the second semiconductor chip 200 may be respectively bonded to the first bonding pads 130 disposed on the first upper surface 112 of the first wafer W1. In the thermal compression process, an adhesive material **510*a* may be formed between the first wafer W1 and the second semiconductor chip 200. For example, the adhesive material 510** may include a non-conductive film (NCF) material.

Then, processes similar to those described with reference to FIGS. 6 to 18 may be performed to form third and fourth semiconductor chips 300, 400. The third and fourth semiconductor chips 300, 400 may be sequentially disposed on the second semiconductor chip 200. A front surface of the third semiconductor chip 300 may be stacked toward a rear surface of the second semiconductor chip 200. A front surface of the fourth semiconductor chip 400 may be stacked to face a rear surface of the third semiconductor chip 300. In the thermal compression process, the adhesive material 510*b* may be formed between the second and third semiconductor chips 200, 300.

The third semiconductor chip 300 and the second semiconductor chip 200 may be bonded to each other by the flip chip bonding by the thermal compression process. For example, the third conductive bumps 340 of the third semiconductor chip 300 may be directly bonded to the second bonding pads 230 of the second semiconductor chip 200.

Similarly, the fourth semiconductor chip 400 and the third semiconductor chip 300 may be bonded by the flip chip bonding by the thermal compression process. For example, the fourth conductive bumps 440 of the fourth semiconductor chip 400 may be directly bonded to the third bonding pads 330 of the third semiconductor chip 300. In the thermal compression process, the adhesive material 510*c* may be formed between the third and fourth semiconductor chips 300, 400.

It will be understood that the number of stacked semiconductor chips is not necessarily limited thereto. For example, 4, 8, or 12 semiconductor chips may be sequentially stacked on the fourth semiconductor chip 400.

As illustrated in FIGS. 20 to 22, the adhesive material 510*b* may be dispersed between the second and third semiconductor chips 200, 300 by the thermal compression process. The adhesive material 510*b* may be dispersed from the central region CA to the edge region EA on the second upper surface 212 of the second semiconductor chip 200.

Since the adhesive material 510*b* is dispersed from the central region CA to the edge region EA, the adhesive material 510*b* might not be sufficiently dispersed in the edge region EA. The adhesive material 510*b* might not be sufficiently dispersed in the first to fourth corner regions C1, C2, C3, C4 of the second semiconductor chip 200.

In the thermal compression process, the third semiconductor chip 300 may receive a force from the third upper surface 312. The adhesive material 510*b* disposed between the second and third semiconductor chips 200, 300 may support the force.

The second dummy pads 260 formed on the second upper surface 212 of the second semiconductor chip 200 may support the third lower surface 314 of the third semiconductor chip 300 in the edge region EA where the adhesive material 510*b* is not sufficiently dispersed. The second dummy pads 260 may support the third lower surface 314 of the third semiconductor chip 300 in the first to fourth corner regions C1, C2, C3, C4.

Similarly, the first dummy pads 160 formed on the first upper surface 112 of the first wafer W1 may support the second lower surface 214 of the second semiconductor chip 200 in the edge region EA where the adhesive material 510*a* is not sufficiently dispersed. The first dummy pads 160 may support the second lower surface 214 of the second semiconductor chip 200 in the first to fourth corner regions C1, C2, C3, C4.

The third dummy pads 360 formed on the third upper surface 312 of the third semiconductor chip 300 may support the fourth lower surface 414 of the fourth semiconductor chip 400 in the edge region EA where the adhesive material 510*c* is not sufficiently dispersed. The third dummy pads 360 may support the fourth lower surface 414 of the fourth semiconductor chip 400 in the first to fourth corner regions C1, C2, C3, C4.

Figure 23:
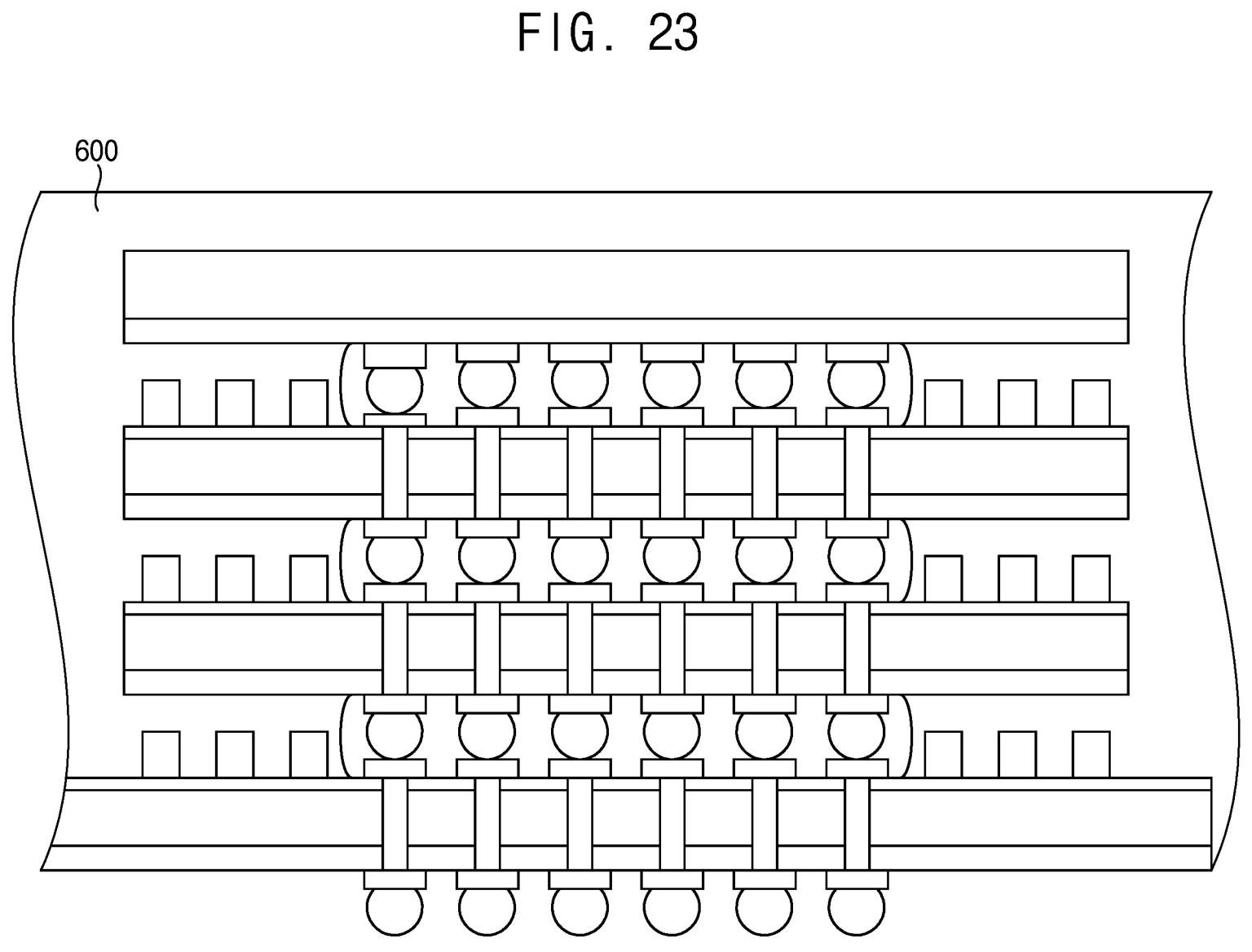

Referring to FIG. 23, a seal 600 may be formed on stacked structures of the first wafer W1 and the second to fourth semiconductor chips 200, 300, 400.

In example embodiments, the seal 600 may be formed on the first wafer W1 to fill spaces between the second, third, and fourth semiconductor chips 200, 300, 400. The seal 600 may surround the second, third, and fourth semiconductor chips 200, 300, 400. The seal 600 may be formed by a dispensing process or a spin coating process. For example, the seal 600 may include a thermosetting resin or the like.

Figure 24:
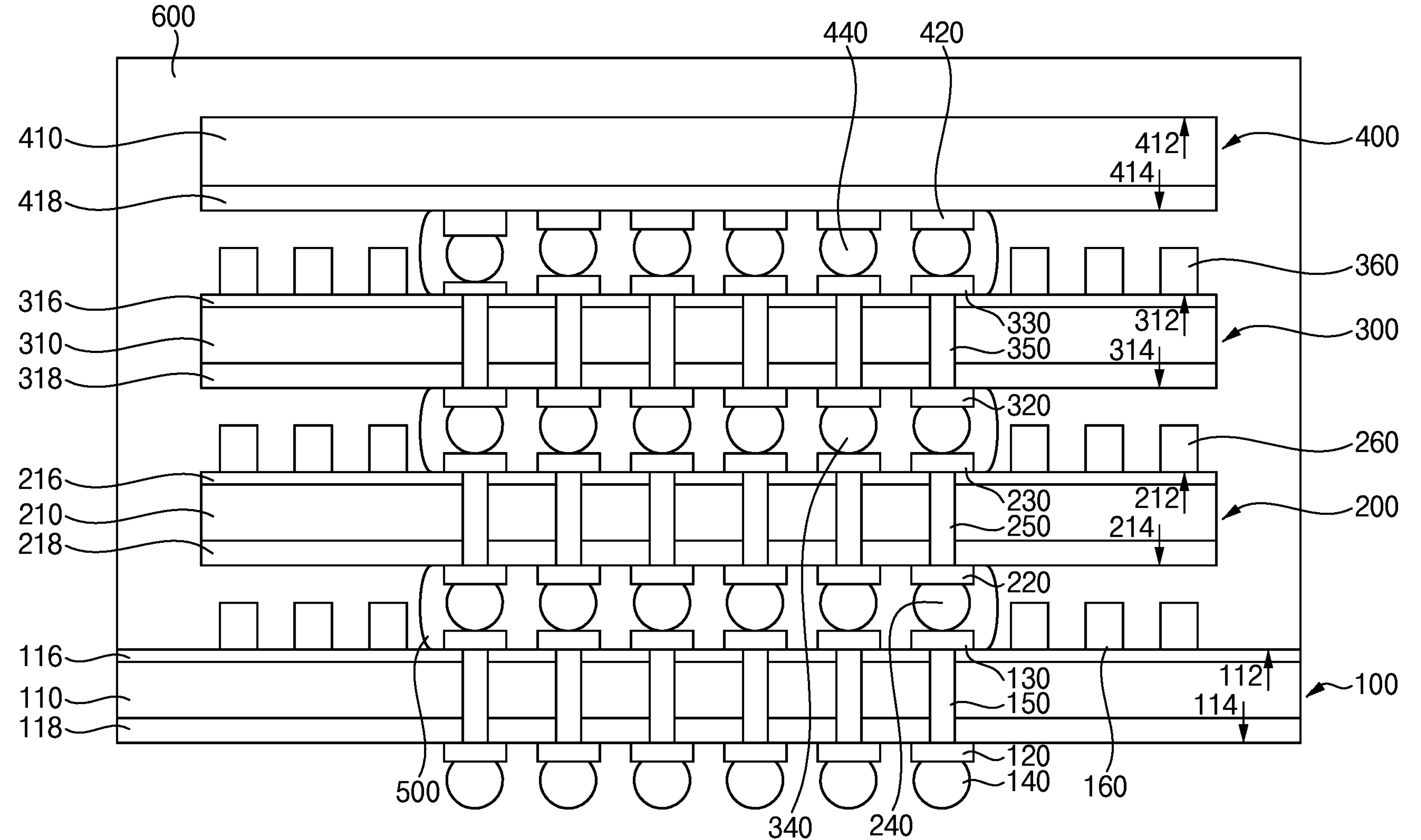

Referring to FIG. 24, the first wafer W1 and the seal 600 may be cut along the scribe lane region to form the semiconductor package in FIG. 1. The first wafer W1 and the seal 600 may be cut by a dicing process.

Figure 25:
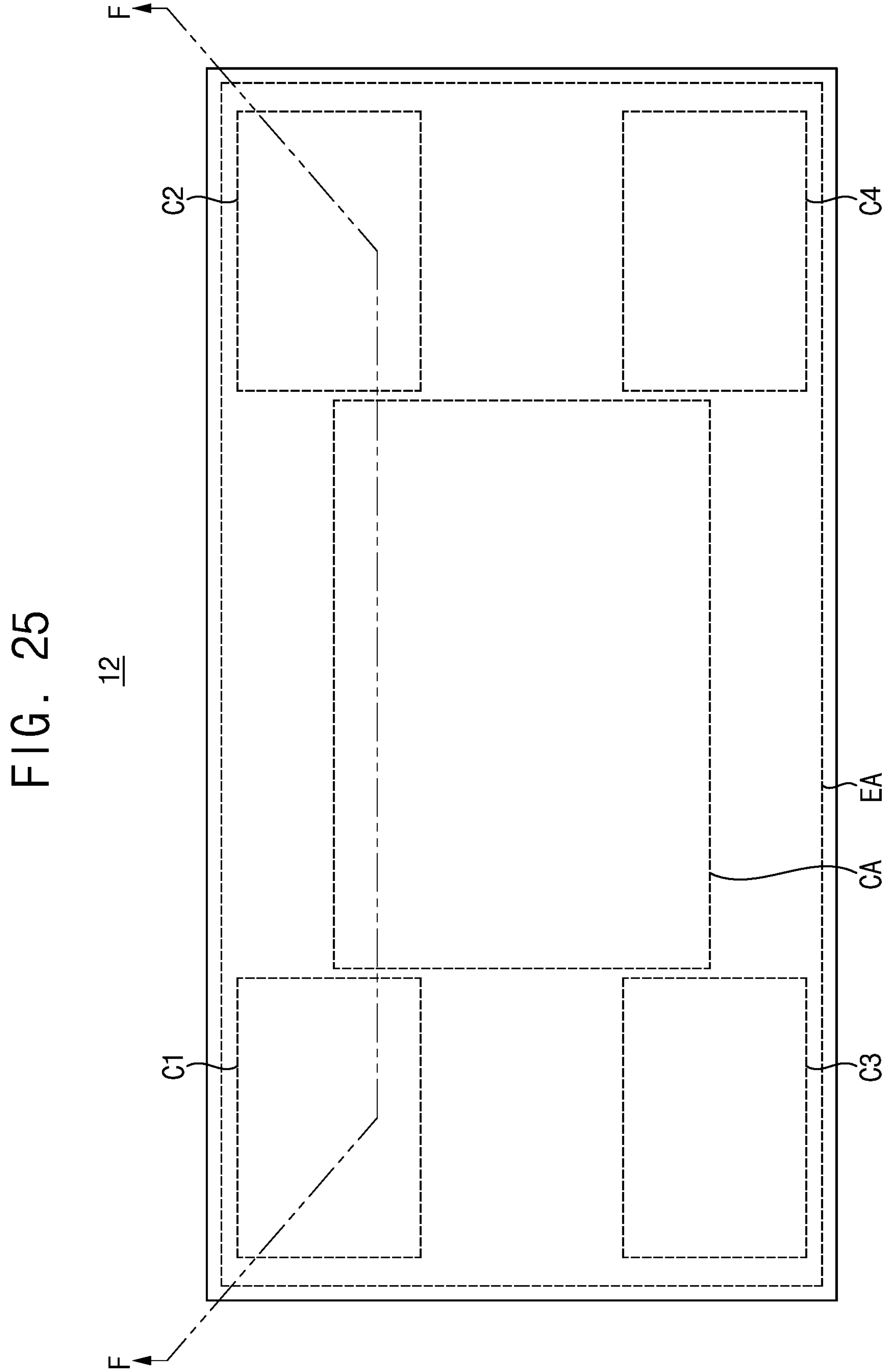
FIG. 25 is a plan view illustrating a semiconductor package including dummy pads having support pads in accordance with example embodiments.
Figure 27:
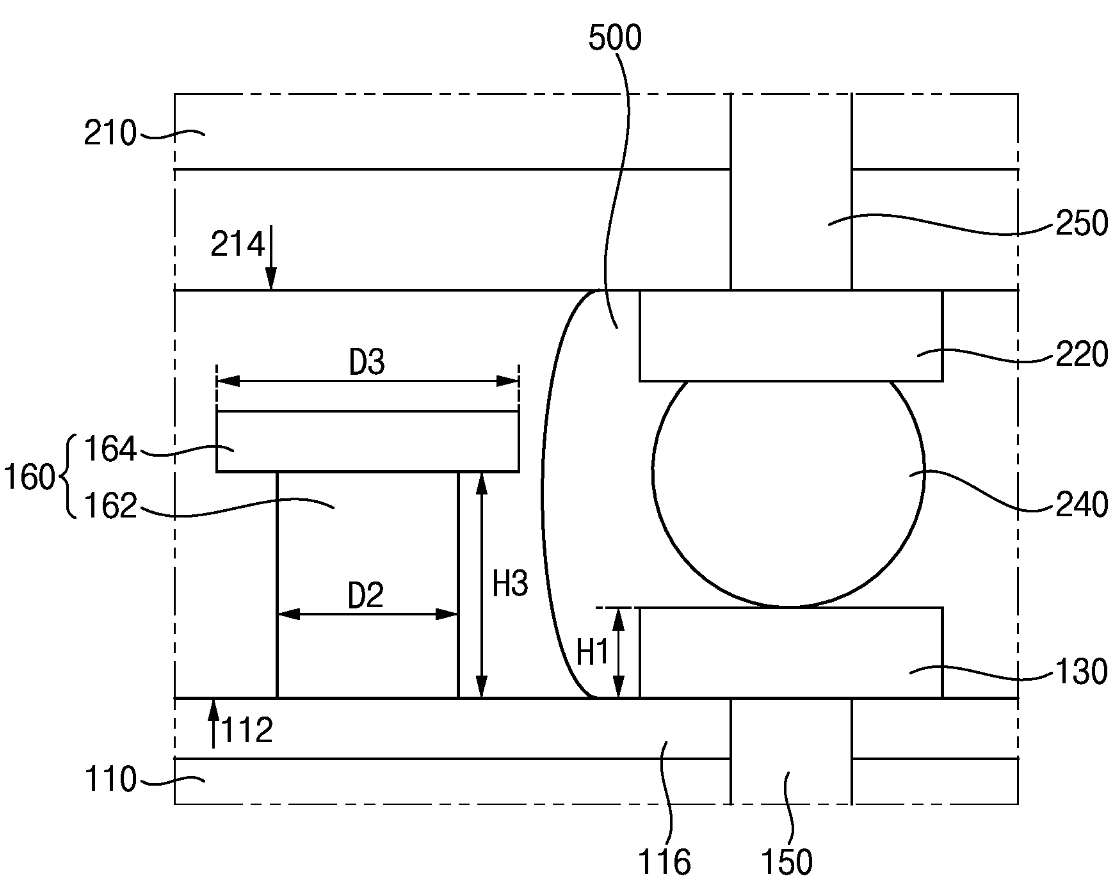
FIG. 27 is an enlarged cross-sectional view illustrating portion G' in FIG. 26.

FIG. 25 is a plan view illustrating a semiconductor package including dummy pads having support pads in accordance with example embodiments. FIG. 26 is a cross-sectional view taken along the line F-F' in FIG. 25. FIG. 27 is an enlarged cross-sectional view illustrating portion 'G' in FIG. 26. The semiconductor package may be substantially the same as or similar to the semiconductor package described with reference to FIGS. 1 to 5 except for a configuration of a dummy pad. Thus, same or similar components are denoted by the same or similar reference numerals, and to the extent that a description of such an element has been omitted, it may be understood that the element is at least similar to a corresponding element that has been described herein.

Referring to FIGS. 25 to 27, a semiconductor package 12 may include the first to fourth semiconductor chips 100, 200, 300, 400 and the adhesive 500.

The first semiconductor chip 100 of the semiconductor package 12 may include the first substrate 110 having the first upper surface 112 and the first lower surface 114 opposite to the first upper surface 112, the first connecting pad 120 disposed on the first lower surface 114, the first bonding pad 130 disposed on the first upper surface 112, the first conductive bump 140 disposed on the first connecting pad 120, and the first dummy pad 160 disposed on the first upper surface 112. Also, the first semiconductor chip 100 may include the first through electrode 150 penetrating the first substrate 110.

In example embodiments, the first dummy pad 160 may include a support bar 162 extending in the vertical direction from the first upper surface 112 and support pad 164 disposed on support bar 162.

The support bars 162 may respectively extend from the first upper surface 112 of the first substrate 110 in the vertical direction. The support bar 162 may have a second diameter D2 and a third height H3. The third height H3 of the support bar 162 may be higher than the first height H1 of the first bonding pad 130. Since the third height H3 of the support bar 162 is higher than the first height H1 of the first bonding pad 130, the support bar 162 may support the second lower surface 214 of the second semiconductor chip 200 when the second semiconductor chip 200 is bent under force. For example, the third height H3 of the support bar 162 may be within a range of 3 μm to 30 μm. The second diameter D2 of the support bar 162 may be within a range of 10 μm to 50 μm.

The support pad 164 may be disposed at one end of the support bar 162. The support pad 164 may have a third diameter D3. The third diameter D3 of the support pad 164 may be larger than the second diameter D2 of the support bar 162. For example, the third diameter D3 of the support pad 164 may be within a range of 15 μm to 70 μm.

Since the third diameter D3 of the support pad 164 is larger than the second diameter D2 of the support bar 162, the first dummy pads 160 may support the second lower surface 214 of the second semiconductor chip 200 with the larger area in a bonding process of connecting the first semiconductor chip 100 and the second semiconductor chip 200 mounted on the first semiconductor chip 100 to each other.

The foregoing is illustrative of example embodiments and is not to be construed as necessary limiting thereof. Although a few example embodiments have been described, those skilled in the art will readily appreciate that many modifications are possible in example embodiments without materially departing from the novel teachings and aspects of the present disclosure.

What is claimed is:

1. A semiconductor package, comprising:

a first semiconductor chip including a substrate having a first upper surface and a first lower surface opposite to the first upper surface, the substrate having a central region and edge regions surrounding the central region, a plurality of through electrodes penetrating through the central region of the substrate, a bonding pad electrically connected to the through electrode and having a first height from the first upper surface, and a plurality of dummy pads respectively extending from the first upper surface on the edge regions of the substrate and having a second height that is higher than the first height;

a second semiconductor chip having a second upper surface and a second lower surface opposite to the second upper surface, the second semiconductor chip disposed on the first semiconductor chip via conductive bumps that are disposed on the second lower surface and are electrically connected to the bonding pads; and an adhesive configured to fill a space between the first and second semiconductors in the central region excluding corner regions of the substrate.

2. The semiconductor package of claim 1, wherein each of the plurality of dummy pads is in contact with the second lower surface of the second semiconductor chip.

3. The semiconductor package of claim 1, wherein the second height of each of the plurality of dummy pads is within a range of 3 μm to 30 μm.

4. The semiconductor package of claim 1, wherein the plurality of dummy pads are disposed in four corner regions on the first upper surface.

5. The semiconductor package of claim 4, wherein the number of the dummy pads of the plurality of dummy pads that are disposed in each of the corner regions is within a range of 10 to 100.

6. The semiconductor package of claim 1, wherein a diameter of each of the plurality of dummy pad is within a range of 10 μm to 50 μm.

7. The semiconductor package of claim 1, wherein each of the plurality of dummy pads includes copper (Cu), aluminum (Al), tungsten, nickel (Ni), molybdenum (Mo), gold (Au), silver (Ag), chromium (Cr), tin (Sn), and/or titanium (Ti).

8. The semiconductor package of claim 1, wherein each of the plurality of dummy pad includes:

a support bar extending in a vertical direction from the first upper surface; and a support pad disposed on the support bar and having a second diameter that is greater than a first diameter of the support bar.

9. The semiconductor package of claim 1, further comprising:

a third semiconductor chip disposed on the second semiconductor chip, wherein the second semiconductor chip further includes a plurality of second dummy pads respectively extending from the second upper surface in a vertical direction to support a lower surface of the third semiconductor chip.

* * * * *